US012627116B2

(12) United States Patent
Miyata

(10) Patent No.: US 12,627,116 B2
(45) Date of Patent: May 12, 2026

(54) LIGHT SOURCE DEVICE AND METHOD OF MANUFACTURING SAME

(71) Applicant: NICHIA CORPORATION, Anan (JP)

(72) Inventor: Tadaaki Miyata, Yokohama (JP)

(73) Assignee: NICHIA CORPORATION, Anan (JP)

( * ) Notice: Subject to any disclaimer, the term of this patent is extended or adjusted under 35 U.S.C. 154(b) by 560 days.

(21) Appl. No.: 18/189,290

(22) Filed: Mar. 24, 2023

(65) Prior Publication Data

US 2023/0327396 A1     Oct. 12, 2023

(30) Foreign Application Priority Data

Mar. 28, 2022    (JP) ................................. 2022-052066

(51) Int. Cl.
H01S 5/024          (2006.01)
H01S 5/02218        (2021.01)
H01S 5/023          (2021.01)
H01S 5/02315        (2021.01)

(52) U.S. Cl.
CPC ...... *H01S 5/02453* (2013.01); *H01S 5/02218* (2021.01); *H01S 5/023* (2021.01); *H01S 5/02315* (2021.01); *H01S 5/02469* (2013.01); *H01S 5/02476* (2013.01)

(58) Field of Classification Search
CPC ...... H01S 5/022; H01S 5/023; H01S 5/02476; H01S 5/0469
See application file for complete search history.

(56) References Cited

U.S. PATENT DOCUMENTS

| | | | |
|---|---|---|---|
| 5,357,056 A | 10/1994 | Nagano | |
| 9,224,672 B1 | 12/2015 | Pykäri et al. | |
| 2016/0268770 A1* | 9/2016 | Tazawa | H01S 5/02335 |
| 2016/0359295 A1* | 12/2016 | Lee | H01S 5/0237 |

FOREIGN PATENT DOCUMENTS

| | | |
|---|---|---|
| DE | 10223680.9 A1 | 12/2003 |
| JP | S60-084848 A | 5/1985 |
| JP | S61-047653 A | 3/1986 |
| JP | H05-167128 A | 7/1993 |
| JP | H05-326734 A | 12/1993 |
| JP | 2005-347684 A | 12/2005 |
| JP | 2016-167492 A | 9/2016 |
| JP | 2020-061482 A | 4/2020 |
| JP | 2021-068794 A | 4/2021 |

* cited by examiner

*Primary Examiner* — Michael Carter
(74) *Attorney, Agent, or Firm* — Foley & Lardner LLP

(57)            ABSTRACT

A light source device includes: a substrate having a support face; a lateral wall part disposed on the substrate and having an upper face and inner wall faces, the inner wall faces defining a space; a laser diode located in the space; a first submount having a mounting face bonded to an upper face of the laser diode, and an upper face located opposite the mounting face; a sealing member bonded to the upper face of the lateral wall part and the upper face of the first submount, thereby sealing the space; a heat dissipating block located above the first submount; and a heat conducting member located between the first submount and the heat dissipating block.

17 Claims, 14 Drawing Sheets

LIGHT SOURCE DEVICE AND METHOD OF MANUFACTURING SAME

CROSS-REFERENCE TO RELATED APPLICATIONS

This application is based upon and claims the benefit of priority from Japanese Patent Application No. 2022-052066, filed on Mar. 28, 2022, the entire contents of which are incorporated herein by reference.

BACKGROUND

The present disclosure relates to a light source device and a method of manufacturing the light source device.

A light emitting device equipped with a sealing structure to seal the space in a package in which a laser diode is housed has been developed. Japanese Patent Publication No. 2016-167492 discloses a light emitting device comprising an upper substrate, a lower substrate opposing the upper substrate, a submount supporting a laser diode, and a wavelength conversion part. In this light emitting device, the laser diode is disposed between the lower substrate that is bonded to the submount and the upper substrate. The wavelength conversion part forms a space in which the laser diode is sealed.

SUMMARY

An embodiment of the present disclosure provides a new sealing structure for hermetically sealing the space in the package in which a laser diode is housed.

A light source device according to the present disclosure, in a non-limiting exemplary embodiment, includes a substrate having a support face, a lateral wall part disposed on the substrate and having a first upper face and inner wall faces, the inner wall faces defining a space, one or more laser diodes located in the space, a first submount having a first mounting face bonded to the upper face(s) of the laser diode(s) and a second upper face located opposite the first mounting face, a sealing member bonded to the first upper face and the second upper face thereby sealing the space, a heat dissipating block located above the first submount, and a heat conducting member located between the first submount and the heat dissipating block, in which the height of the first upper face from the support face differs from the height of the second upper face from the support face, the heat conducting member is in thermal contact with the first submount and the heat dissipating block, and the heat dissipating block is bonded to the first upper face of the lateral wall part via the sealing member.

A method of manufacturing a light source device according to the present disclosure, in a non-limiting exemplary embodiment, includes a step of bonding a light source unit having a submount and a laser diode bonded to the submount to the support face of a substrate, a step of bonding a lateral wall part to the support face to surround the light source unit, a step of bonding a sealing member to the submount and the lateral wall part to seal the light source unit in the space defined by the substrate and the lateral wall part, a step of disposing a heat conducting member above the submount of the light source unit, and a step of deforming the heat conducting member to bond a heat dissipating block to the lateral wall part via the sealing member thereby bringing the heat dissipating block into thermal contact with the heat conducting member.

According to an exemplary embodiment of the present disclosure, a new sealing structure can be provided for hermetically sealing the space in the package in which a laser diode is housed.

DETAILED DESCRIPTION

Figure 1:
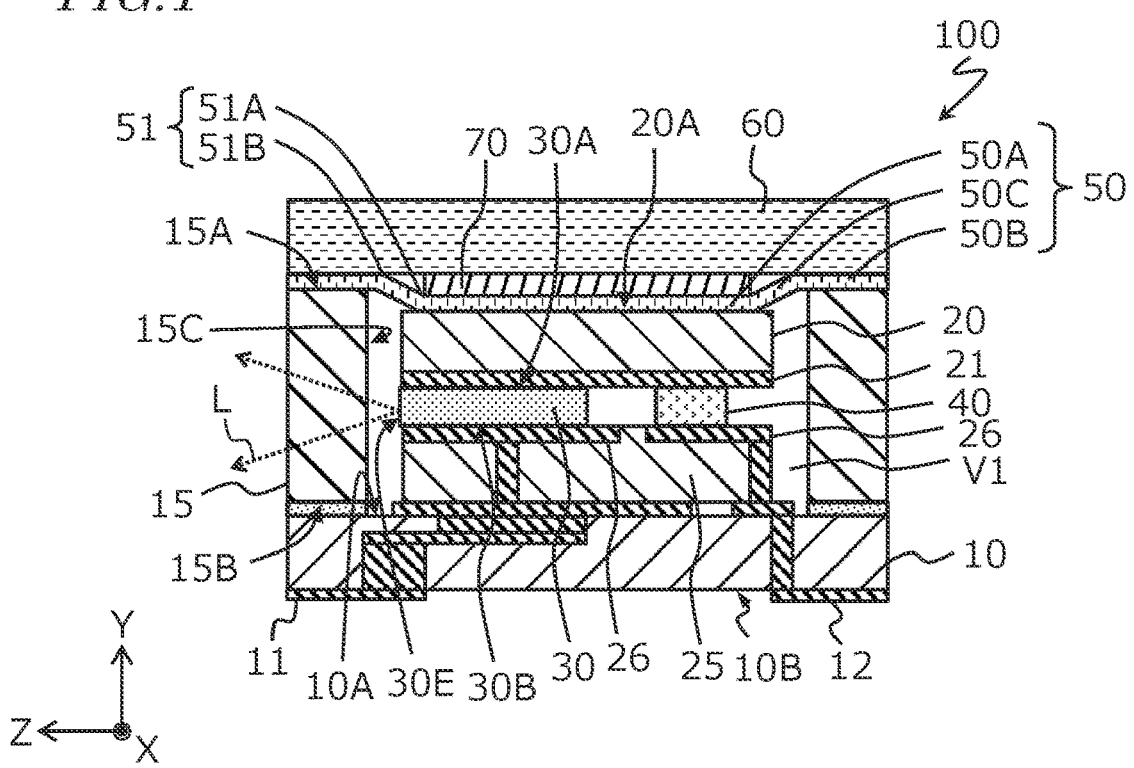
FIG. 1 is a cross-sectional view paralleling a YZ plane of a light source device according to a first embodiment of the present disclosure.

Certain embodiments of the present disclosure will be explained in detail below with reference to the accompanying drawings. The embodiments described below are exemplary, and the light source devices according to the present disclosure are not limited to those described below. For example, the numerical values, shapes, materials, manufacturing steps, and the sequence of the steps described in the embodiments below are merely examples, and are modifiable in various ways to the extent that such a modification does not cause technical inconsistencies. The various forms described below are merely exemplary, and various combinations can be made to the extent that such a combination does not cause technical inconsistencies.

The dimensions, shapes and the like of the constituent elements shown in the drawings might be exaggerated for clarity of explanation, and might not reflect the dimensions and shapes of, and the relative sizes among the constituent elements in an actual light source device. Certain elements might be omitted in a drawing so as not to make the drawing excessively complex.

In the description below, the constituent elements having practically the same functions are denoted by common reference numerals for which explanation might be omitted. Terms indicating specific directions or positions (e.g., "upper," "lower," "right," "left" and other terms including or related to these) might be used. These terms, however, are merely used in order to make the relative directions or positions in the drawings being referenced more easily understood. As long as the relationship between relative directions or positions indicated with the terms such as "upper," "lower," or the like is the same as those in a referenced drawing, the layout of the elements in other drawings, or actual products and manufacturing equipment outside of the present disclosure, does not have to be the same as those shown in the referenced drawing.

In the description or the accompanying claims, a polygon, such as a triangle, rectangle, or the like, is not limited to those in the strict mathematical sense, and includes a shape subjected to processing, such as cutting angles, chamfering, beveling, rounding, or the like. Moreover, the location of such processing is not limited to a corner (an end of a side) of a polygon. Rather, a shape subjected to processing in the intermediate portion of a side will similarly be referred to as a polygon. In other words, any polygon-based shape subjected to partially processing should be understood to be included in the interpretation of a "polygon."

In the description or the accompanying claims, moreover, when there are multiple pieces of a certain component and a distinction must be made, a word such as "first," "second," or the like might occasionally be added. These words are merely labels added to distinguish the subjects, and do not have any particular meaning as to the numbers, the order or the sequence of the subjects. For example, if claim 1 in the scope of claims includes the term "first submount," but not the term "second submount," the invention of claim 1 can simply include one submount, and the submount is not limited to the "first submount" in the description, but rather can be the "second submount" in the description.

A light source device according to an embodiment of the present disclosure includes a substrate having a support face, a lateral wall part disposed on the substrate and defining a space with the inner wall faces, one or more laser diodes located in the space, a first submount having a first mounting face bonded to the upper face(s) of the laser diode(s) and a second upper face that is located opposite the first mounting face, a sealing member bonded to the first upper face of the lateral wall part and the second upper face of the first submount to seal the space, a heat dissipating block located above the first submount, and a heat conducting member located between the first submount and the heat dissipating block. Here, the height of the first upper face from the support face differs from the height of the second upper face from the support face. The sealing member functions as a cap of the package that hermetically seals the space that houses the laser diode(s). An example of the sealing member is metal foil. Using metal foil as the sealing member makes it easier to absorb the height difference between the first upper face and the second upper face. Furthermore, the heat conducting member is in thermal contact with the first submount and the heat dissipating block. The heat conducting member allows the heat generated by the laser diode(s) to efficiently escape to the outside through the heat dissipating block. The heat dissipating block is bonded to the first upper face of the lateral wall part via the sealing member. Supporting the heat dissipating block with the lateral wall part can secure the mechanical strength for retaining the heat dissipating block.

First Embodiment

Examples of certain forms of a light source device according to a first embodiment of the present disclosure will be explained with reference to FIG. 1 to FIG. 18. In the drawings, X axis, Y axis, and Z axis that are orthogonal to one another are indicated for reference purposes. The X axis, Y axis, and Z axis directions will be referred to as the X direction, Y direction, and Z direction below. The Z direction is the light emission direction of a laser diode. The Y direction is perpendicular to the support face of the substrate. In the explanation below, "when viewed from above" means viewing a subject in a direction normal to the support face of the substrate, i.e., in the Y direction.

Figure 2:
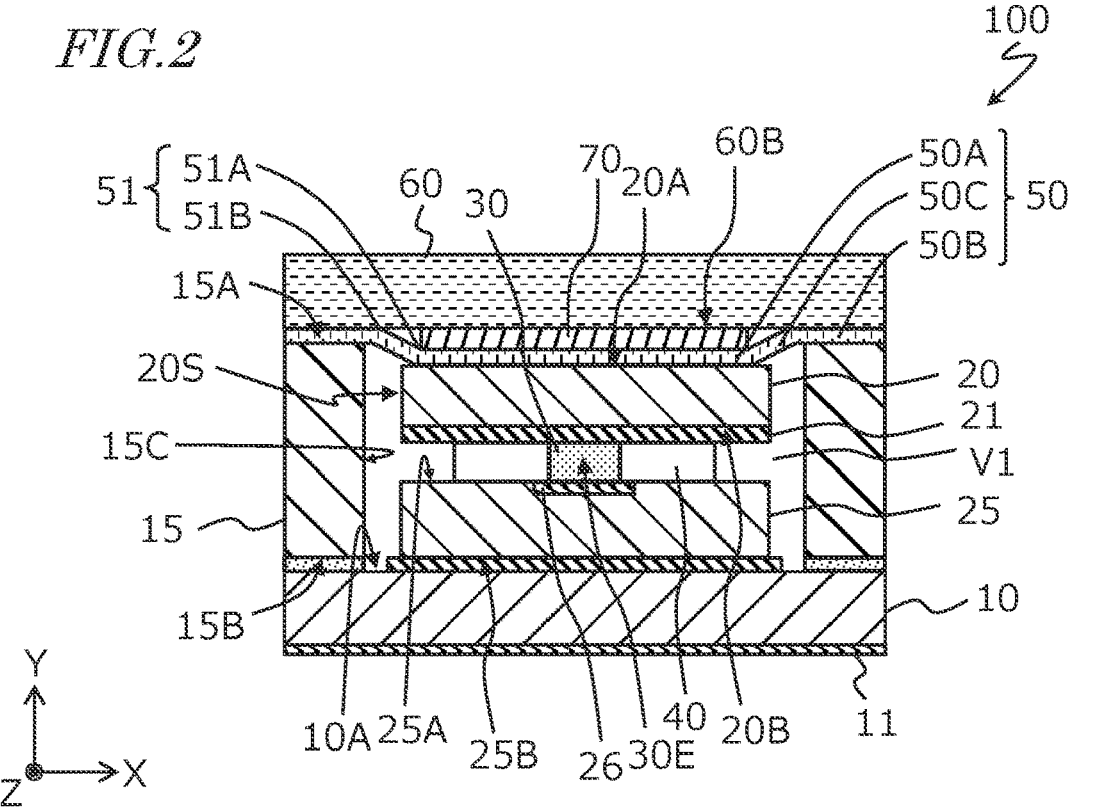
FIG. 2 is a cross-sectional view paralleling an XY plane of the light source device according to the first embodiment of the present disclosure.
Figure 3:
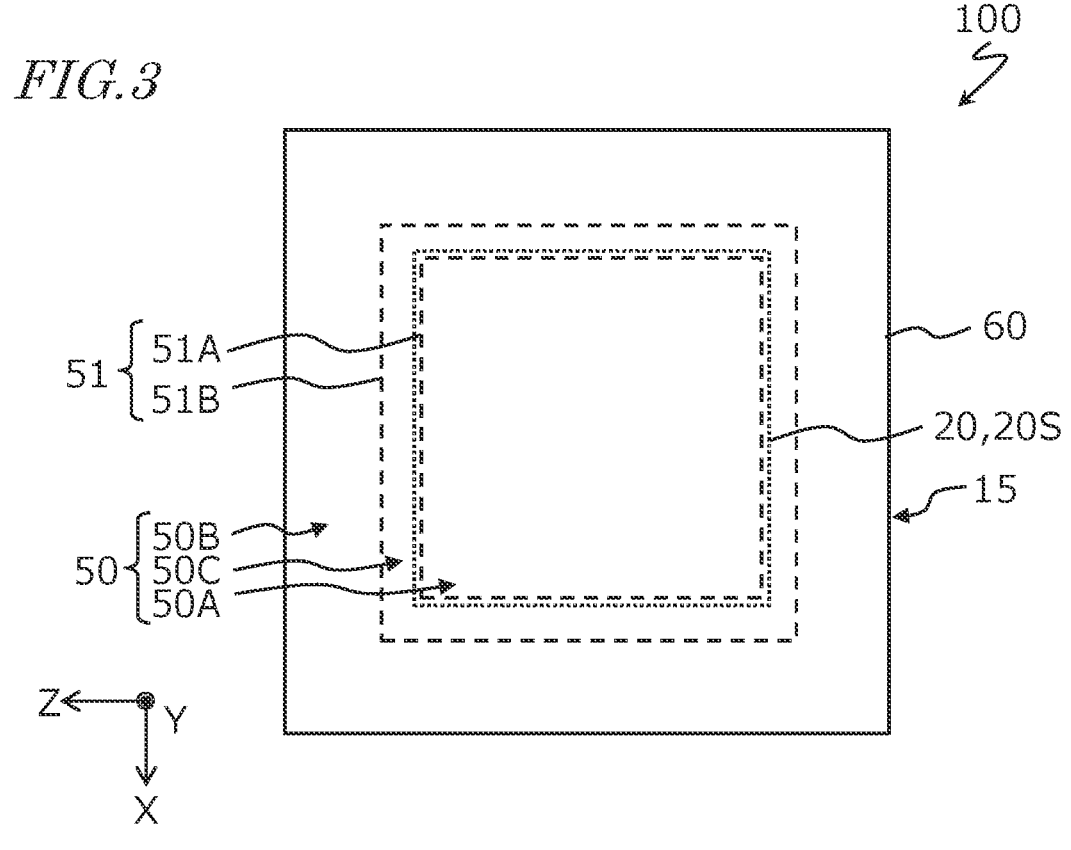
FIG. 3 is a plan view of the light source device according to the first embodiment of the present disclosure.

FIG. 1 is a cross-sectional view paralleling a YZ plane of a light source device 100. The cross section shown in FIG. 1 includes cross sections of a laser diode 30 and a conducting member 40. The laser light L emitted from the emission face 30E of the laser diode 30 in the Z direction is indicated by broken lines. FIG. 2 is a cross-sectional view paralleling an XY plane of the light source device 100. The cross section shown in FIG. 2 includes the emission face 30E of the laser diode 30. FIG. 3 is a plan view of the light source device 100 when viewed from above.

The light source device 100 illustrated in FIG. 1 and FIG. 2 includes a substrate 10, a first submount 20, a second submount 25, a laser diode 30, a conducting member 40, a scaling member 50, a heat dissipating block 60, and a heat conducting member 70. The light source device 100 includes a single laser diode 30. However, as described later, a light source device according to an embodiment of the present disclosure can include multiple laser diodes 30. Depending on the product specifications or required specifications, the light source device 100 can include a protective device represented by a Zener diode and/or a temperature sensor such as a thermistor for measuring the internal temperature. The light source device 100 can further include a photodetector such as a photodiode for monitoring the intensity of the laser light L emitted by the laser diode 30.

As illustrated in FIG. 3, the shape of the light source device 100 viewed in a direction normal to the support face 10A of the substrate 10, i.e., when viewed from above, is quadrangular. However, the shape of the light source device is not limited to this. For example, the size of the light source device 100 is about 1.0 mm to about 30.0 mm in the X direction, and about 1.0 mm to about 10.0 mm in the Z direction. The thickness of the light source device 100 in the Y direction can be about 1.0 mm to about 10.0 mm.
Substrate 10

A substrate 10 in the light source device 100 is a sheet shaped member. The substrate 10 has a support face 10A that directly or indirectly supports a laser diode 30, and a lower face 10B located opposite the support face 10A. On the support face 10A of the substrate 10, a metal film such as gold can be formed for bonding another member, such as a lateral wall part 15, a second submount 25, or the like. The substrate 10 can be formed by using a ceramic, metal, or resin as a main material. When using a ceramic, for example, aluminum nitride, silicon nitride, aluminum oxide, silicon, or silicon carbide can be used as a main material for the substrate. When using a metal, copper, aluminum, or iron, or as a composite material, copper-molybdenum, copper-diamond, or copper-tungsten can be used as a main material for the substrate. In the case of using a metal, however, the support face 10A and the lower face 10B need to be insulated because a conductor wiring layer is disposed on the substrate. The portion directly under the laser diode 30 may be formed from a metal, and the remaining portion from a ceramic.

The substrate 10 has conductor wiring layers and external connection electrodes electrically connected to the laser diode 30. The conductor wiring layers and the external connection electrodes can be formed from a metal material, such as tungsten, molybdenum, nickel, gold, silver, platinum, titanium, copper, aluminum, or ruthenium. A conductor wiring layer can be provided on the support face 10A of the substrate 10 and inside the substrate 10, and an external connection electrode 11 and an external connection electrode 12 on the lower face 10B of the substrate 10. The conductor wiring layer disposed on the support face 10A and the external connection electrodes 11 and 12 disposed on the lower face 10B are electrically connected via the conductor wiring layer disposed in the substrate 10 and a via hole.

The external connection electrode 11 is electrically connected to one of the p-side electrode face and the n-side electrode face of the laser diode 30. The external connection electrode 12 is electrically connected to the other of the p-side electrode face and the n-side electrode face of the laser diode 30. For example, an external power source or drive circuit for driving the laser diode 30 can be electrically connected to the laser diode 30 via the external connection electrode 11 and the external connection electrode 12. The external connection electrode 11 and the external connection electrode 12 do not need to be disposed on the lower face 10B as illustrated in FIG. 1, and may be disposed, for example, on the support face 10A.

Figure 4:
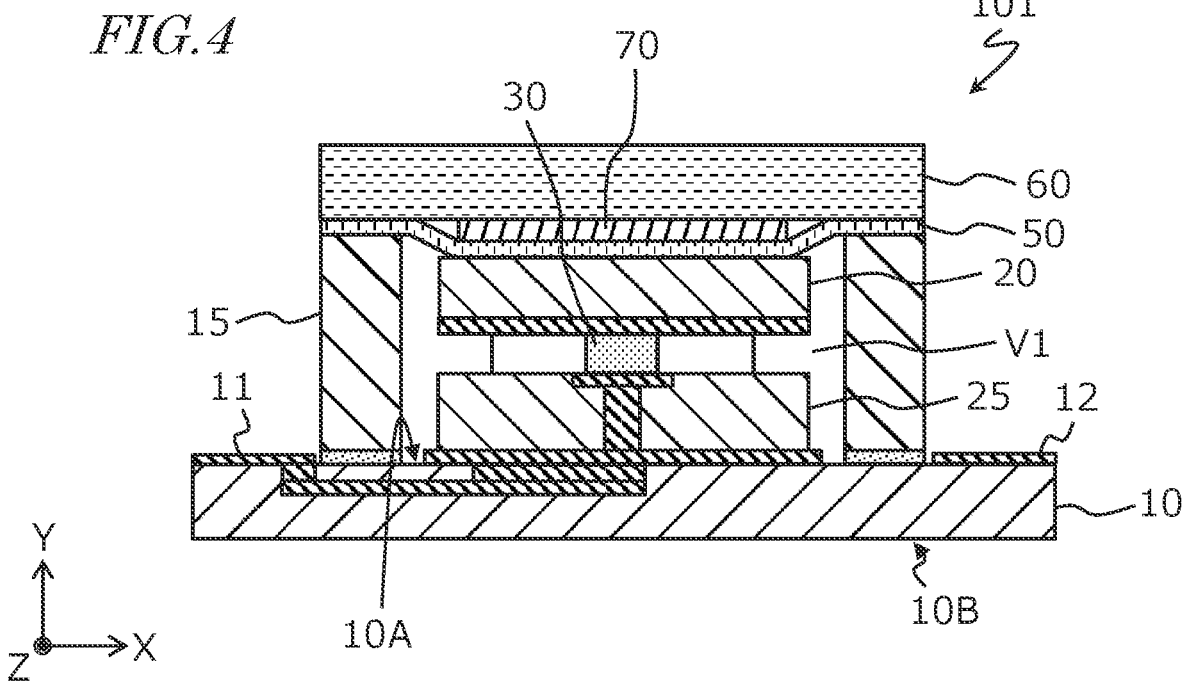
FIG. 4 is a cross-sectional view paralleling an XY plane of a light source device according to the first embodiment of the present disclosure in which the external connection electrodes are disposed on the support face of the substrate.

FIG. 4 is a cross-sectional view paralleling an XY plane of a light source device 101 in which the external connection electrode 11 and the external connection electrode 12 are disposed on the support face 10A. The external connection electrode 11 and/or the external connection electrode 12 can be disposed on the support face 10A. As illustrated in FIG. 4, the size of the substrate 10 when viewed from above may be made larger than the size of the lateral wall part 15 to dispose the external connection electrode 11 and the external connection electrode 12 on the support face 10A in the region outward of the lateral wall part 15.
Lateral Wall Part 15

A lateral wall part 15 is disposed to surround the laser diode 30 and bonded to the support face 10A. The lateral wall part 15 is a member that extends in the Y direction. The lateral wall part 15 has a first upper face 15A, a lower face 15B, and inner wall faces 15C. The inner wall faces 15C surround the laser diode 30, defining the space V1 in which the laser diode 30 is housed. The lower face 15B of the lateral wall part 15 is bonded to the support face 10A of the substrate 10. The bonding can be accomplished via a bonding member made of an inorganic or organic material. The bonding is performed, for example, by sintering, brazing, soldering, ultrasonic welding, resistance welding, or laser welding. For the material for the bonding member, for example, a metal, such as a gold-tin or solder alloy, a metal paste containing metal particles, such as a gold paste or silver paste, or metal foil can be used. A metal paste has an organic binder and metal particles dispersed in the binder. The organic binder in a metal paste is volatilized when heated, and the bonding member is formed by the metal particles that remain after a hardening heat treatment. However, for a blue or green light emitting laser diode, the use of an organic material is preferably avoided considering the dust attraction effect of the laser light.

The lateral wall part 15 is positioned on the support face 10A in the path of the outgoing laser light L from the laser diode 30, and includes a portion that transmits the laser light L. At least the portion of the lateral wall part 50 where the laser light L passes through can be formed with a material, such as alkali glass, alkali-free glass, sapphire, glass containing a phosphor, a ceramic material, or the like. "Alkali glass" is silicic acid glass containing mobile ions of alkali metal elements, such as Nat, Kat, Lit, and the like. Silicic acid glass having an alkali oxide concentration of 0.1 mass % or lower is referred to as "alkali-free glass." Examples of silicic acid glass include silicate glass, borosilicate glass, and quartz glass. The portion of the lateral wall part 15 where the laser light L does not pass through may be formed, for example, from silicon, glass, ceramic, or the same material as that for the substrate 10 described above. A metal film or dielectric film may be formed on the surface of the lateral wall part 15.

In an embodiment of the present disclosure, a substrate 10 and a lateral wall part 15 are separate members. The substrate 10 and the lateral wall part 15 might be collectively referred to as a "package." A package may be a structure in which a substrate 10 and a lateral wall part 15 are integrally formed.

Laser Diode 30

A laser diode 30 has a p-side electrode, an n-side electrode, and a semiconductor stack structure that includes a p-side semiconductor layer, an n-side semiconductor layer, and an active layer positioned between these layers. When a voltage is applied across the p-side electrode and the n-side electrode to allow an electric current to flow internally, the laser diode 30 emits laser light L from the emission face 30E. The laser diode 30 in this embodiment is an edge-emitting laser diode having an emission face 30E through which laser light L exits. The laser diode 30 may be a single emitter laser diode that has one emitter, or a multi-emitter laser diode that has two or more emitters.

In this embodiment, the surface of the n-side electrode is referred to as "n-side electrode face 30A" and the surface of the p-side electrode is referred to as "p-side electrode face 30B." The laser diode 30 has a p-side electrode face 30B, and an n-side electrode face 30A that is located opposite the p-side electrode face 30B.

For the laser diode 30, for example, a blue light emitting laser diode, a green light emitting laser diode, or a red light emitting laser diode can be employed. Furthermore, light other than visible light, for example, a near-infrared or ultraviolet light emitting laser diode may be employed.

In the present specification, blue light refers to light having a peak emission wavelength in the 420 nm to 494 nm range. Green light refers to light having a peak emission wavelength in the 495 nm to 570 nm range. Red light refers to light having a peak emission wavelength in the 605 nm to 750 nm range.

Blue or green light emitting laser diodes are, for example laser diodes including nitride semiconductors. For nitride semiconductors, for example, GaN, InGaN, and AlGaN can be used. Examples of red light emitting laser diodes include those including InAlGaP based, GaInP based, GaAs based, and AlGaAs based semiconductors.

The laser light emitted from a laser diode is divergent in both the fast axis and the slow axis directions, and forms an elliptical far field pattern (hereinafter referred to as "FFP") in a plane parallel to the emission face. The laser light is more divergent in the fast axis direction than the slow axis direction. An FFP is defined by the light intensity distribution of the laser light at a location distant from the emission face. In the light intensity distribution, the portion having the intensity of at least $1/e^2$ of the peak intensity can be referred to as a "beam cross section." The broken lines indicating the laser light L in FIG. 1 show the light that define the periphery of a beam cross section. The optical axis of the laser light L emitted from the laser diode 30 parallels the Z direction. The fast axis and slow axis directions parallel the Y and X directions, respectively. Here, being parallel can include tolerances of up to +5 degrees. The optical axis of the laser light L does not have to parallel the Z direction.

After exiting the emission face 30E of the laser diode 30, the laser light L diverges in the fast and slow directions, i.e., the Y and X directions, as illustrated in FIG. 1. Accordingly, the laser light L is preferably collimated or converged by an optical system that includes a lens. Such an optical system can be provided inside or outside of the light source device 100.

First Submount 20 and Second Submount 25

A first submount 20 and a second submount 25 are heat dissipating members, and typically have rectangular cuboid shapes. However, the shape of each submount is not limited to this. Each submount plays the role of allowing the heat generated by the laser diode 30 to escape. From the standpoint of further improving heat dissipation performance, each submount is preferably formed from a material having a higher thermal conductivity than that of the laser diode 30. For the material, for example, a ceramic material, such as aluminum nitride, silicon nitride, aluminum oxide, or silicon carbide, a metal material, such as copper, aluminum, silver, iron, nickel, molybdenum, tungsten, or copper-molybdenum, or diamond can be used.

The first submount 20, as shown in FIG. 2, has a first mounting face 20B opposing the support face 10A of the substrate 10 while interposing the laser diode 30, and a second upper face 20A located opposite the first mounting face 20B. The first submount 20 has on the first mounting face 20B a first wiring layer 21 electrically connected to the laser diode 30. In the example shown in FIG. 1 and FIG. 2, the n-side electrode face 30A of the laser diode 30 is bonded to the first wiring layer 21. This allows the laser diode 30 to be in thermal contact with and electrically connected to the first submount 20. Here, the term "in thermal contact with" means not only the case in which the electrode face is indirectly in contact with the submount via a solid conducting member, but also the case in which the electrode face is directly in contact with the submount.

The bonding of the n-side electrode face 30A of the laser diode 30 and the first wiring layer 21 can be accomplished via a bonding member. The bonding member is, for example, a metal, such as gold, silver, copper, aluminum, gold-tin, or solder, or a metal paste containing conductive metal particles of gold, silver, copper, gold-tin, or solder. The "bonding member" described below can be formed from the materials described above unless otherwise specified.

The second submount 25, as illustrated in FIG. 2, has a lower face 25B bonded to the support face 10A and a second mounting face 25A located opposite the lower face 25B. The second mounting face 25A opposes the first mounting face 20B of the first submount 20. The second submount 25 has a second wiring layer 26, which is electrically connected to the laser diode 30, on the second mounting face 25A. The lower face 25B can be bonded to the support face 10A of the substrate 10 via a bonding member.

On the second mounting face 25A of the second submount 25, the laser diode 30 is disposed. A via hole can be created in the second submount 25. In the example shown in FIG. 1 and FIG. 2, the laser diode 30 is bonded to the support face 10A via the second submount 25. To explain in more detail, the p-side electrode face 30B of the laser diode 30 can be bonded to the second wiring layer 26 via a bonding member. The p-side electrode face 30B is electrically connected to the conductor wiring layer of the substrate 10 via the via hole that electrically connect the second wiring layer 26 and the conductor wiring layer disposed on the lower face 25B of the second submount 25.

The first submount 20 and the second submount 25 are disposed to interpose the laser diode 30. Allowing the pair of submounts to interpose the laser diode 30 can efficiently transfer the heat generated by the laser diode 30 to the first submount 20 and the second submount 25. The heat dissipation effect can conceivably be further improved by setting the thickness of the laser diode 30 to 20 μm or smaller, preferably about several μm. When the thermal conductivity of the first submount 20 and the second submount 25 is higher than the thermal conductivity of the laser diode 30, in particular, the heat dissipation effect can conceivably be improved by reducing the thickness of the laser diode 30.

In the example of the light source device 100 shown in FIG. 1 and FIG. 2, the first submount 20 is equal to the second submount 25 in size. However, the size of the first submount 20 may be different from the size of the second submount 25. For example, when viewed from above, the first submount 20 may enclose the second submount 25, or conversely, the second submount 25 may enclose the first submount 20. In the Y direction, the first submount 20 may be thicker or thinner than the second submount 25. When viewed from above, the center of the first submount 20 may be shifted from the center of the second submount 25 in the X direction and/or the Z direction.

As described above, the n-side electrode face 30A of the laser diode 30 is bonded to the first wiring layer 21 of the first submount 20. The p-side electrode face 30B is bonded to the second wiring layer 26 of the second submount 25. However, the upper/lower positions of the n-side electrode face 30A and the p-side electrode face 30B can be reversed to bond the p-side electrode face 30B to the first wiring layer 21.

One of the p-side electrode face 30B and the n-side electrode face 30A of the laser diode 30 can be bonded to the support face 10A of the substrate 10, and the other of the p-side electrode face 30B and the n-side electrode face 30A can be bonded to the first mounting face 20B of the first submount 20. Here, bonding one of the p-side electrode face 30B and the n-side electrode face 30A to the support face 10A means that either is directly or indirectly bonded to the support face 10A. In the example of the light source device 100 shown in FIG. 1 and FIG. 2, the p-side electrode face 30B is indirectly bonded to the support face 10A of the substrate 10 via the second submount 25, and the n-side electrode face 30A is bonded to the first mounting face 20B of the first submount 20. If no second submount 25 is provided, the p-side electrode face 30B can be directly bonded to the support face 10A of the substrate 10. When bonded in this manner, the external connection electrode 11 is electrically connected to the p-side electrode face 30B, and the external connection electrode 12 is electrically connected to the n-side electrode face 30A via the conducting member 40 described later. When one of the p-side electrode face 30B and the n-side electrode face 30A is directly bonded to the support face 10A, the portion of the substrate 10 that is bonded to the laser diode 30 is preferably greater in thickness than the other portion of the substrate 10. This can prevent vignetting where the substrate 10 blocks the light exiting the laser diode 30.

The p-side electrode and the n-side electrode can be positioned on the same face, either the upper face of the laser diode 30 that opposes the first submount 20 or the lower face that opposes the second submount 25. In other words, the n-side electrode face 30A and the p-side electrode face 30B can be located on the same face of the laser diode 30. When the face of the laser diode 30 where the n-side electrode face 30A and the p-side electrode face 30B are located (referred to as the "electrode face") is electrically connected to the first wiring layer 21 of the first submount 20, the face of the laser diode 30 located opposite the electrode face is in thermal contact with the second submount 25. Conversely, when the electrode face of the laser diode 30 is electrically connected to the second wiring layer 26 of the second submount 25, the face of the laser diode 30 located opposite the electrode face is in thermal contact with the first submount 20.

The laser diode 30 is indirectly mounted on the support face 10A of the substrate 10 in the state of being bonded to the second submount 25. The laser diode 30 is located between the substrate 10 and the first submount 20. However, the laser diode 30 can be directly bonded to the support face 10A without interposing a second submount 25. Accordingly, the second submount 25 is not necessarily an essential member in this embodiment. However, using a second submount 25 can provide the benefit as the thickness adjustment of the second submount 25 allows for the position adjustment of the emission region of the laser diode 30 in the height direction, i.e., the Y direction, relatively easily.

Conducting Member 40

A conducting member 40 is a member formed from a metal, such as gold, silver, copper, aluminum, gold-tin, or solder. The conducting member 40 can be formed to have the same thickness as that of the laser diode 30. The conducting member 40 has an upper face that opposes the first mounting face 20B of the first submount 20 and a lower face located opposite the upper face and bonded to the second mounting face 25A. The conducting member 40, for example, is a rectangular cuboid member, but is not limited to this shape as long as it has a lower face that is bonded to the second mounting face 25A.

The conducting member 40 is bonded to the first submount 20 and the second submount 25, electrically connecting the first wiring layer 21 and the second wiring layer 26. Specifically, the lower face of the conducting member 40 is bonded to the second wiring layer 26 disposed on the second mounting face 25A. The upper face of the conducting member 40 is bonded to the first wiring layer 21 disposed on the first mounting face 20B. The conducting member 40 can be bonded to the first wiring layer 21 and the second wiring layer 26 via a bonding member. This electrically connects the n-side electrode face 30A of the laser diode 30 to the first wiring layer 21 and the second wiring layer 26. As a result, the n-side electrode face 30A can be electrically connected to the external connection electrode 12 disposed on the lower face 10B of the substrate 10. Such a wiring configuration eliminates the need for conventional wire bonding that draws gold wires or the like from the n-side electrode face 30A to the second wiring layer 26, thereby bringing the laser diode 30 into thermal contact with the first submount 20 easily. However, the n-side electrode face 30A and the second wiring layer 26 may be electrically connected by wire bonding without using a conducting member 40.

Matching the height of the conducting member 40 to the height of the laser diode 30 in the Y direction can make it easy to bond both the laser diode 30 and the conducting member 40 to the first submount 20 and the second submount 25, while maintaining the first mounting face 20B and the second mounting face 25A in parallel with one another. Here, being parallel includes tolerances of up to +5 degrees.

Sealing Member 50

A sealing member 50 in an embodiment of the present disclosure functions as a cap for the package that hermetically seal the space V1 that houses the laser diode 30. An example of the sealing member 50 is metal foil. The thickness of the metal foil is roughly 10 μm to 300 μm. The thickness of the metal foil does not need to be constant. For example, the thickness of the deformed part 51 described later of the sealing member 50 may be smaller than the thickness of the other portion of the sealing member 50. As a base material for the metal foil, for example, at least one selected from the group consisting of aluminum, copper, gold, Kovar®, titanium, stainless steel, tungsten, beryllium copper, nickel, silver, platinum, nichrome, tantalum, molybdenum, and niobium, or their alloys can be used.

The base material is preferably covered by a metal film formed from, for example, at least one material selected from the group consisting of gold, platinum, titanium, nickel, chromium, palladium, and ruthenium. The metal film can be formed on the surface of the base material by a film forming process, for example, sputtering, plating, or the like.

Heat Dissipating Block 60

The heat dissipating block 60 illustrated in FIG. 1 and FIG. 2 is a rectangular cuboid similar to the first submount 20 or the second submount 25, but is not limited to this. The heat dissipating block 60 can be formed from the same materials as those for the submount described above. The heat dissipating block 60 is located above the first submount 20. The heat dissipating block 60 has a lower face 60B opposing the second upper face 20A of the first submount 20. As illustrated in FIG. 3, the size of the heat dissipating block 60 in an XZ plane is about the same as the size of the lateral wall part 15 or the substrate in the XZ plane. The heat dissipating block 60 has only to be supported by at least a portion of the first upper face 15A of the lateral wall part 15, and can have any shape or size when viewed from above. As illustrated in FIG. 4, the size of the heat dissipating block 60 in an XZ plane may be smaller or larger than the size of the substrate 10 in the XZ plane. The size of the heat dissipating block 60 in an XZ plane may be smaller or larger than the size of the lateral wall part 15 in the XZ plane.

Figure 5A:
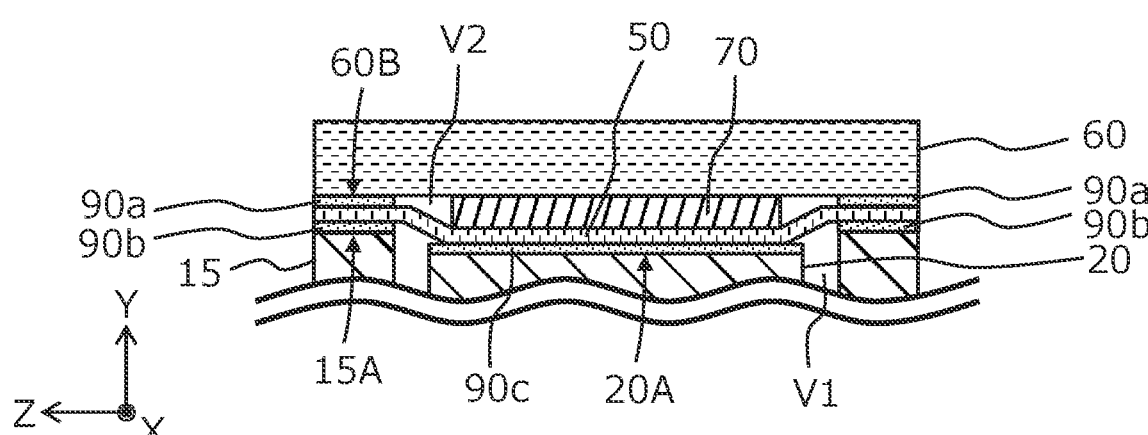
FIG. 5A is an enlarged cross-sectional view enlarging the portion where the sealing member is bonded to the first upper face of the lateral wall part and the lower face of the heat dissipating block in FIG. 1.
Figure 5B:
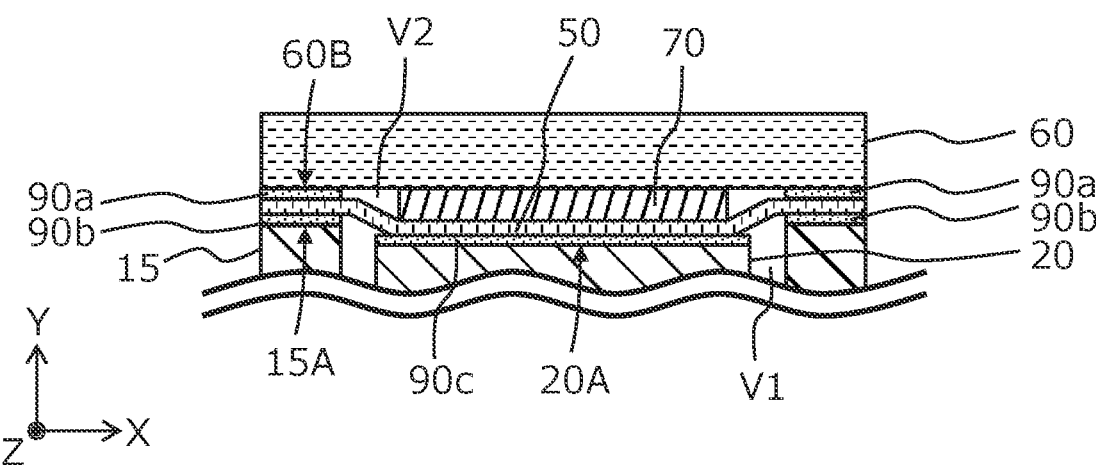
FIG. 5B is an enlarged cross-sectional view enlarging the portion where the sealing member is bonded to the first upper face of the lateral wall part and the lower face of the heat dissipating block in FIG. 2.

FIG. 5A is an enlarged cross-sectional view enlarging the portion of the cross section in FIG. 1 where the sealing member 50 is bonded to the upper face 15A of the lateral wall part 15 and the lower face 60B of the heat dissipating block 60. FIG. 5B is an enlarged cross-sectional view enlarging the portion of the cross section in FIG. 2 where the sealing member 50 is bonded to the upper face 15A of the lateral wall part 15 and the lower face 60B of the heat dissipating block 60.

The heat dissipating block 60 is bonded to the first upper face 15A of the lateral wall part via the sealing member 50. The sealing member 50 is bonded to the first upper face 15A of the lateral wall part 15 and the second upper face 20A of the first submount 20, and further bonded to the lower face 60B of the heat dissipating block 60. The lower face 60B of the heat dissipating block 60 is bonded to the sealing member 50 via a bonding member 90a, and the first upper face 15A of the lateral wall part 15 is bonded to the sealing member 50 via a bonding member 90b. The second upper face 20A of the first submount 20 is bonded to the sealing member 50 via a bonding member 90c. The bonding members 90a, 90b, and 90c can be formed from an inorganic material, preferably a metal material, more preferably gold tin. Using gold tin for the material for the bonding members 90a and 90b, in particular, can improve the strength and durability of the bonding members. The bonding members 90a, 90b, and 90c may be formed from the same material or different materials. Furthermore, the material for the bonding member 90a may contain a substance that can expel outgas (organic molecules). This can reduce the penetration of the outgas into the space V1 that is sealed by the sealing member 50. The bonding members 90a, 90b, and 90c in the first embodiment are formed from the same material. Each bonding member can be formed, for example, by sintering, brazing, soldering, ultrasonic welding, resistance welding, or laser welding.

The hermetic sealing structure achieved by a sealing member 50 is not limited to the example shown in FIG. 1 and FIG. 2. The sealing member 50 illustrated in the drawings is bonded to the first upper face 15A of the lateral wall part 15 in its entirety, but can be bonded, for example, to a portion of the first upper face 15A. Various hermetic sealing structures can be employed as long as a hermetic seal is achieved. Hermetic sealing in the present specification means that the space V1 is sealed to the extent that the interaction with outside air is blocked. Hermetically sealing the space V1 can substantially prevent degradation of the members arranged in space V1.

Heat Conducting Member 70

As shown in FIG. 5A or FIG. 5B, the heat conducting member 70 is located in the space V2 created between the first submount 20 and the heat dissipating block 60. In other words, the heat conducting member 70 is disposed in the space V2 formed by the lower face 60B of the heat dissipating block 60, the bonding member 90a, and the sealing member 50. There is a gap between the first submount 20 and the heat dissipating block 60 attributable to the height difference between the first upper face 15A and the second upper face 20A. The distance of the gap is, for example, about ten μm to several hundred μm. The height difference will be described later.

The heat conducting member 70 fills the gap between the first submount 20 and the heat dissipating block 60, and functions as a member to conduct the heat generated by the laser diode 30 to the heat dissipating block 60. Accordingly, the heat conducting member 70 is preferably an easily deformable member with high heat dissipation performance. In other words, the heat conducting member 70 preferably has a relatively high thermal conductivity and relatively low hardness. Hardness is a mechanical property of a material measurable through, for example, durometer hardness testing or Rockwell hardness testing. Furthermore, each member might expand when subjected to the heat generated during the operation of the light source device. In this regard, the heat conducting member 70 is preferably a member having the same or higher linear expansion coefficient as that of the first submount 20 and/or the heat dissipating block 60 so as to absorb the changes in the distance of the gap described earlier resulting from the thermal expansion coefficient differences among the members located in the space V1 and the lateral wall part 15. Allowing the expansion of the heat conducting member 70 to be greater than the expansion of the first submount 20 and/or the expansion of the heat dissipating block 60 at an elevate temperature can prevent these from becoming thermally separated. The heat conducting member 70 can be formed from a material, such as a heat dissipating resin or heat dissipating grease. In this case, the state of the material that forms the heat conducting member 70 may be liquid, solid, or a mixture of these. Alternatively, for the heat-conducting member 70, for example, a heat conducting sheet having cushioning properties, such as a metal sheet, metal fiber sheet, graphite laminated sheet, carbon sheet, or silicone sheet can be used. The heat conducting sheet can be bonded to the sealing member 50 and the heat dissipating block 60 under pressurized conditions, for example.

Alternatively, the heat conducting member 70 can be formed from a metal paste containing particles of gold, gold tin, or the like. The heat conducting member 70 can be formed from an alloy material having stickiness to some degree such as lead solder. The heat conducting member 70 may contain residual organic matter that could not be completely evaporated in the hardening heat treatment during manufacturing. Even in such a case, the presence of the sealing member 50 can deter the penetration of the outgas into the space V1 to reach the emission face of the laser diode 30. This can ensure the reliability of the light source device 100.

Alternatively, the heat conducting member 70 can be formed from a liquid metal. When using a liquid metal, the liquid metal may be combined with any of the heat conducting sheet described above. Using a liquid metal allows it to absorb the initial variations and the changes over time of the height difference between the first upper face 15A of the lateral wall part 15 and the second upper face 20A of the first submount 20 described later. Moreover, combining a liquid metal and a heat conducting sheet facilitates the absorption of the initial variations.

The hardness of the heat conducting member 70 is lower than the hardness of the first submount 20 or the heat dissipating block 60. In the embodiments of the present disclosure, furthermore, the hardness of the heat conducting member 70 may be lower than the hardness of the bonding member 90a or 90b. With these hardness magnitude relations, when the space V1 is sealed with the sealing member 50, the heat conducting member 70 that is softer than the first submount 20 or the heat dissipating block 60 deforms to fill the gap. As a result, the heat dissipating block 60 can be brought into thermal contact with the heat conducting member 70 easily.

The heat conducting member 70 is in thermal contact with the first submount 20 and the heat dissipating block 60. The thermal contact here means that the heat conducting member 70 is not only indirectly in contact with the first submount 20 via the sealing member 50, but also directly in contact with the first submount 20 without interposing a sealing member 50. The heat conducting member 70 in the light source device 100 illustrated in FIG. 1 or FIG. 2 is in thermal contact with the first submount 20 via the sealing member 50. The heat conducting member 70 preferably has a thermal conductivity of 1 W/mK or higher, for example, more preferably 10 W/mK or higher, for example. With the heat conducting member 70 that fills the gap between the first submount 20 and the heat dissipating block 60, the heat generated by the laser diode 30 is conducted to the first submount 20, the heat conducting member 70, and the heat dissipating block 60 in that order. This allows the heat to efficiently escape to the outside, thereby ensuring high heat dissipation performance.

In the embodiments of the present disclosure, the height of the second upper face 20A of the first submount 20 from the support face 10A may be different from the height of the first upper face 15A of the lateral wall part 15 from the support face 10A. In the light source device 100 shown in FIG. 1 and FIG. 2, the height of the second upper face 20A of the first submount 20 from the support face 10A is smaller than the height of the first upper face 15A of the lateral wall part 15 from the support face 10A. The height difference between the first upper face 15A and the second upper face 20A can depend on the manufacturing tolerances for the thicknesses of members such as the first submount 20, the second submount 25, and lateral wall part 15. The height difference in the embodiments of the present disclosure may be, for example, about 10 μm to about 300 μm. The sealing member 50 has a deformed part 51 that results from the height difference. The deformed part 51 may be bent or curved.

The sealing member 50 includes a first portion 50A bonded to the second upper face 20A of the first submount 20, a second portion 50B bonded to the first upper face 15A of the lateral wall part 15, and a connecting part 50C that connects the first portion 50A and the second portion 50B. The deformed part 51 has a first deformed part 51A located at the border between the first portion 50A and the connecting part 50C and a second deformed part 51B located at the border between the second portion 50B and the connecting part 50C. As illustrated in FIG. 1 and FIG. 2, at least a portion of the first portion 50A can be positioned between the heat conducting member 70 and the first submount 20.

Figure 6:
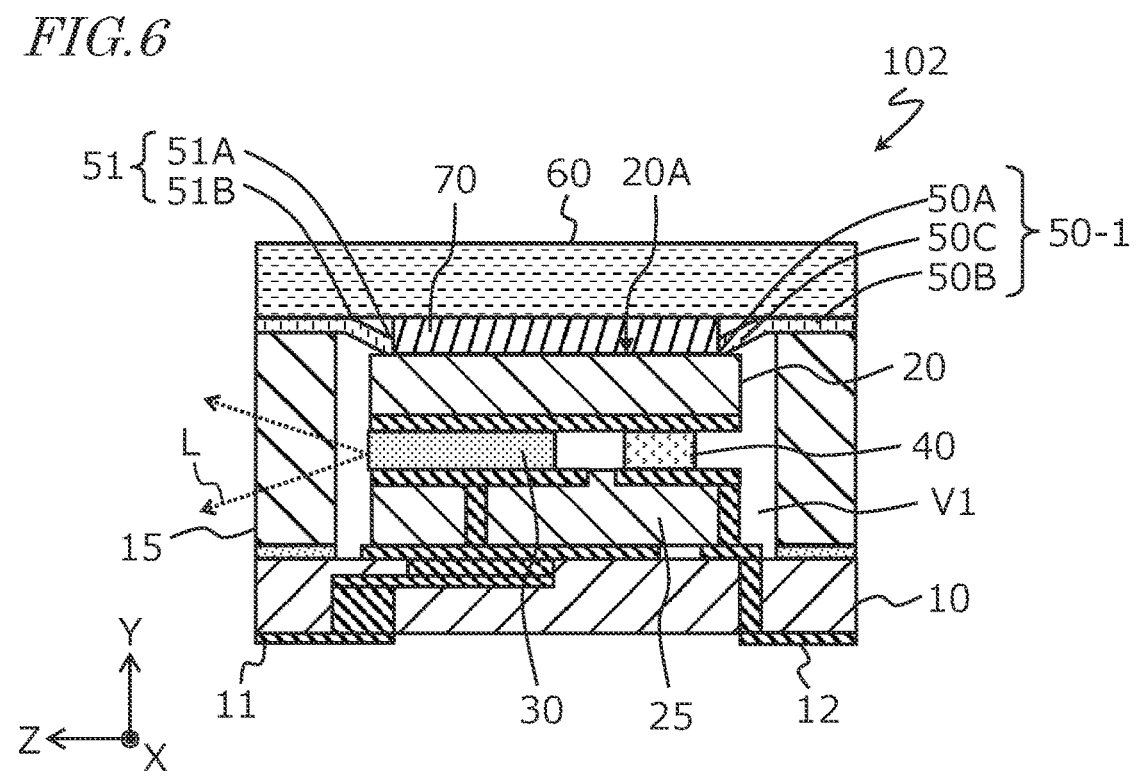
FIG. 6 is a cross-sectional view paralleling a YZ plane of a light source device of another form according to the first embodiment of the present disclosure.
Figure 7:
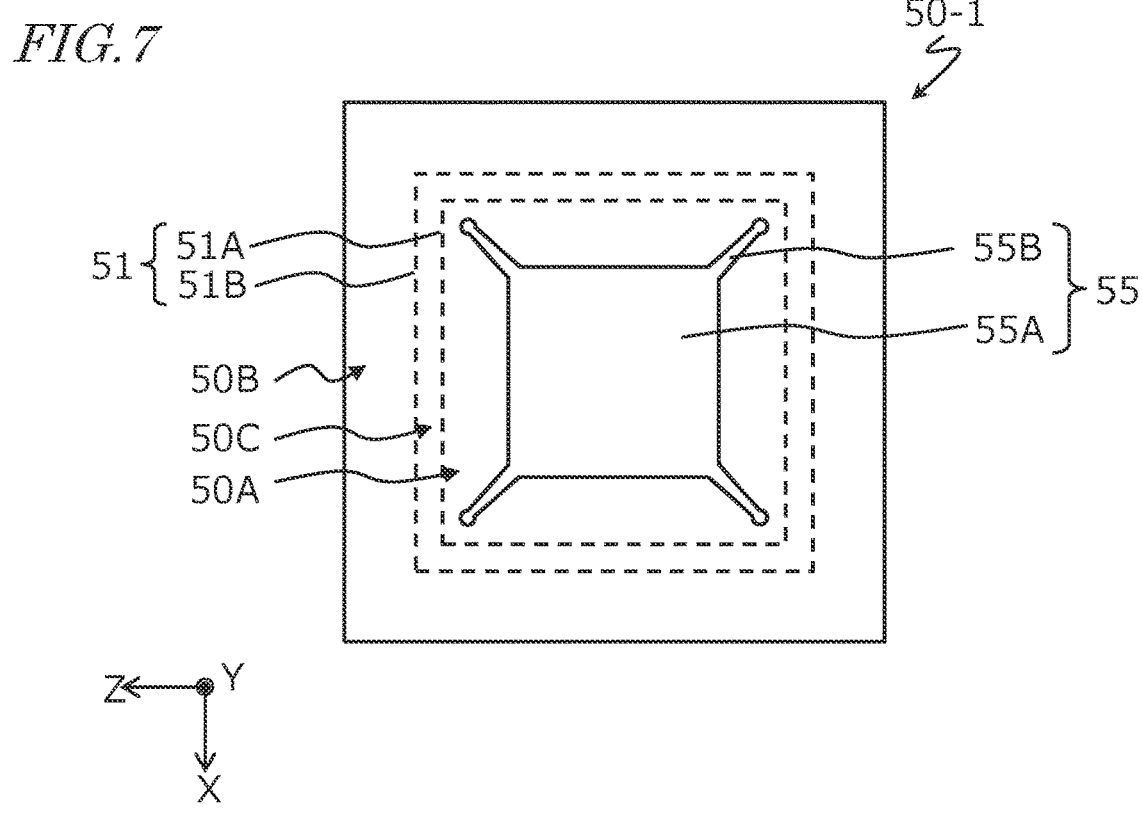
FIG. 7 is a top plan view of the sealing member having another structure.

FIG. 6 is a cross-sectional view paralleling a YZ plane of a light source device 102. FIG. 7 is a plan view of a sealing member 50-1 when viewed from above. As illustrated in FIG. 6, the first portion 50A does not have to be formed between the heat conducting member 70 and the first submount 20. In this case, the first portion 50A can be formed only along the peripheral region of the second upper face 20A of the first submount 20.

The heat conducting member 70 in thermal contact with the heat dissipating block 60 is in thermal contact with the first submount 20 via or without the first portion 50A of the sealing member 50. As a result, the heat conducted from the laser diode 30 to the first submount 20 is allowed to escape to the outside efficiently through the heat conducting member 70 and the heat dissipating block 60.

Unlike the sealing member 50, the sealing member 50-1 illustrated in FIG. 7 has a first portion 50A that has an opening 55. The opening 55 includes a substantially quadrangular central portion 55A and four extended portions 55B extending along the diagonal lines of the central portion 55A. The shape of the opening 55 shown in FIG. 7 is an example, and can vary depending on the design specifications. Providing an opening 55 that includes extended portions 55B in the first portion 50A located in the center of the sealing member 50-1 can efficiently prevent the sealing member from becoming rumpled or wrinkled when bent. The heat conducting member 70 in the light source device 102 is in contact with the portion of the second upper face 20A of the first submount 20 (see FIG. 6) that matches in shape with the central portion 55A of the opening 55. The opening 55 may be provided in the second portion 50B.

Figure 8:
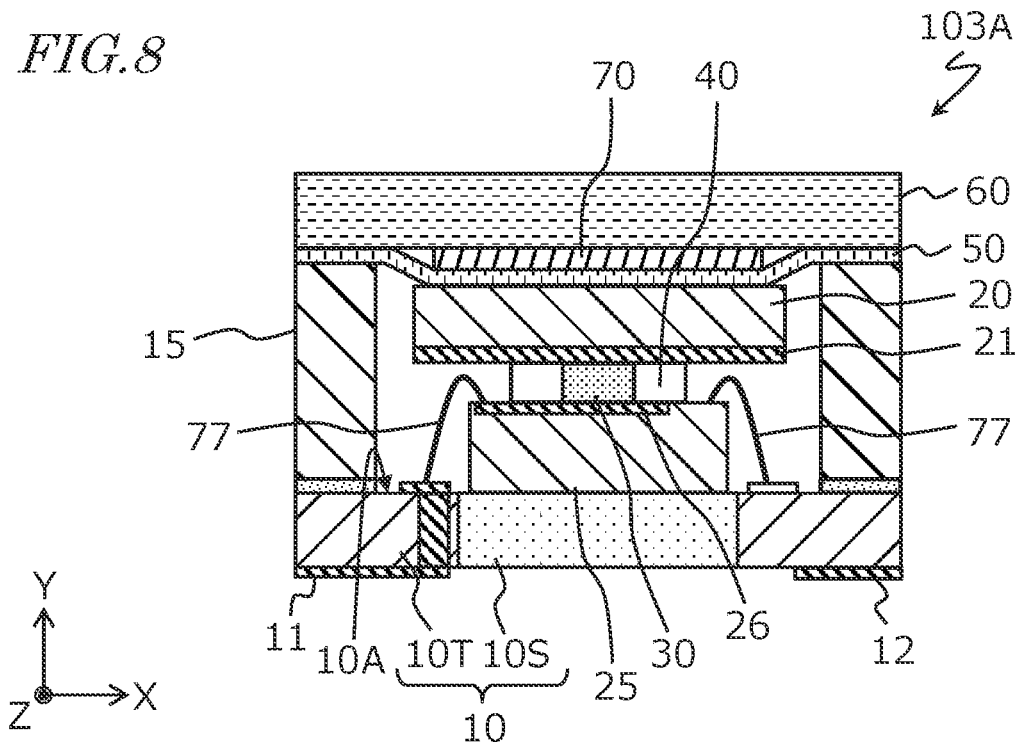
FIG. 8 is a cross-sectional view paralleling an XY plane of a light source device of another form according to the first embodiment.

FIG. 8 is a cross-sectional view paralleling an XY plane of a light source device 103A that includes a substrate 10 made of a composite material. In the light source device 103A illustrated, the substrate 10 is formed from a composite material. The substrate 10 includes a central portion 10S formed, for example, from a metal such as copper, and a peripheral portion 10T (portion other than the central portion 10S) formed from, for example, a ceramic. The central portion 10S of the substrate is located directly under the second submount 25. This can improve the heat dissipation performance of the light source device. The second submount 25 illustrated in FIG. 8, furthermore, does not have any via hole. In this case, the second wiring layer 26 and the conductor wiring layer of the substrate 10 may be electrically connected by using, for example, wires 77 without any via hole. The wires 77 can be formed from a material, such as gold, copper, aluminum, or an alloy containing these.

Figure 9:
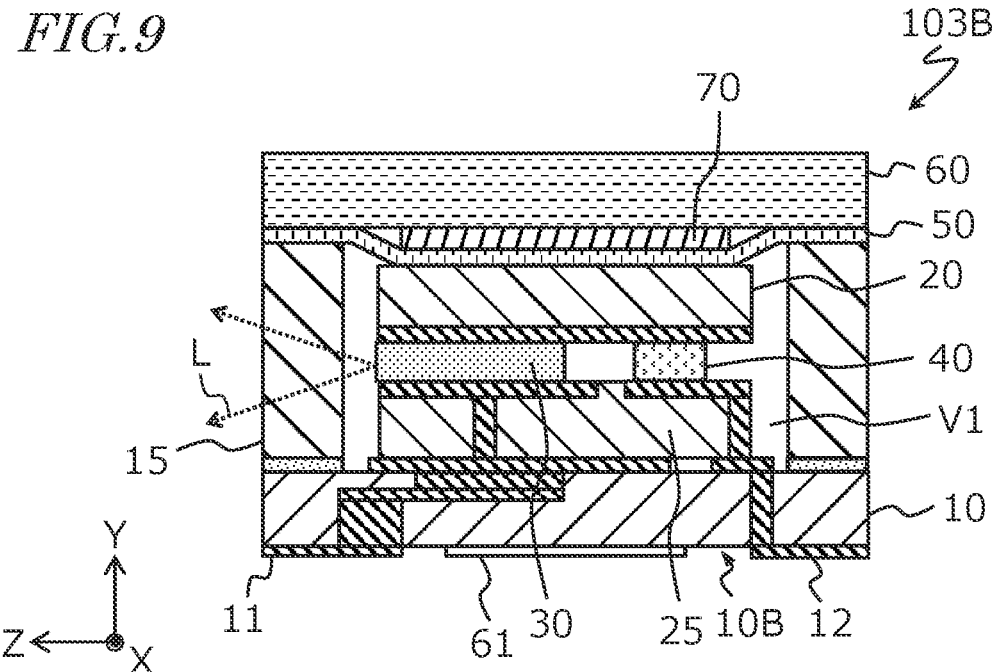
FIG. 9 is a cross-sectional view paralleling a YZ plane of the light source device of another form according to the first embodiment.

FIG. 9 is a cross-sectional view paralleling a YZ plane of a light source device 103B further including a heat dissipating member 61. As illustrated, the light source device 103B can further include a heat dissipating member 61. The heat dissipating member 61 can be disposed on the lower face 10B of the substrate 10. The heat dissipating member 61 may be formed from the same material as or a different material from that for the heat dissipating block 60. For the heat dissipating member 61, for example, a sheet shaped member thinner than the heat dissipating block 60 may be employed, or a layer of a metal film may be formed by sputtering or the like. Providing a heat dissipating member 61 allows the heat conducted through the second submount 25 to efficiently escape to the outside. This can further improve the heat dissipating effect.

Referring back to FIG. 3, the periphery of the second upper face 20A of the first submount 20 located inside the package is indicated by a dotted line to make the relative positions of the submount 20 and the heat dissipating block 60 easier to understood. The first deformed part 51A and the second deformed part 51B of the sealing member 50 are indicated by broken lines.

As illustrated in FIG. 3, when viewed from above, the heat dissipating block 60 encloses the first submount 20. In other words, the size of the heat dissipating block 60 in an XZ plane is larger than the size of the first submount 20 in the XZ plane. The second portion 50B in the example shown in FIG. 3 is the outermost region of the sealing member 50. The second portion 50B overlaps the heat dissipating block 60. There may be a region in the second portion 50B that does not overlap the heat dissipating block 60. Having a heat dissipating block 60 large enough to overlap the second portion 50B in part or whole be in thermal contact with the first submount 20 via the heat conducting member 70 can improve the heat dissipation performance of the light source device 100.

The first submount 20 has first lateral faces 20S along the outer edges. When viewed from above, the first deformed part 51A is positioned inward of the first lateral faces 20S. In other words, the first deformed part 51A is located inward of the outer edges of the first submount 20. The first deformed part 51A is not in contact with the sides of the first submount 20 where the second upper face 20A meets the first lateral faces 20S (i.e., the upper corners of the member). Adjusting the position of the first deformed part 51A so as not to come into contact with the corners of the member can reduce damage to the sealing member 50 that could occur if the first deformed part 51A comes into contact with the corners.

A thin metal such as foil can exert its malleability, particularly ductility. Using ductile metal foil as a cap of the package can reduce thermal stress induced damage to the sealing member 50 while absorbing the height difference between the first upper face 15A of the lateral wall part 15 and the second upper face 20A of the first submount 20. This can also reduce the detachment of the sealing member 50 from at least one of the faces among the first upper face 15A, the second upper face 20A, and the lower face 60B of the heat dissipating block 60.

In the case of employing a blue or green light emitting laser diode, the space V1 of the package is preferably hermetically sealed. Hermetic sealing can reduce the dust collecting effect of the laser beam. In some cases where a package requires hermetic sealing, double-sided bonding of a chip might be required where both faces of a laser diode are bonded to a pair of submount members. In such a case, it is difficult to achieve both hermetic sealing and double-sided bonding of a chip. To explain specifically, the space V1 of the package needs to be hermetically sealed while bonding both faces of the laser diode 30 such that the height of the first upper face 15A from the support face 10A matches the height of the second upper face 20A from the support face 10A. However, a load is applied to the bonding members, for example, when bonding both faces of the chip. The bonding members are not necessarily deformed uniformly by this load. In addition to the shape variations inherent in the members themselves, a height difference might occur between the first upper face 15A and the second upper face 20A attributable to the manufacturing tolerances for the dimensions of the members or the variations resulting in the heights of the bonding members. For this reason, the height difference that can result might vary each time. This makes it difficult to achieve both hermetic sealing and double-sided bonding of a chip.

According to the first embodiment, the sealing member 50 having a deformed part 51 used as the cap of the package can absorb the height gap between the first upper face 15A and the second upper face 20A. This eliminates the need for making fine height adjustments of the members, thereby making the double-sided bonding of a laser diode 30 easy. As such, a sealing structure that can achieve both hermetic sealing and double-sided bonding of a chip can be provided. Moreover, the heat conducting member 70 allows the heat generated by the laser diode 30 to efficiently escape to the outside through the heat dissipating block 60. Furthermore, the lateral wall part 15 supporting the heat dissipating block 60 can ensure the mechanical strength for retaining the heat dissipating block 60.

Figure 10:
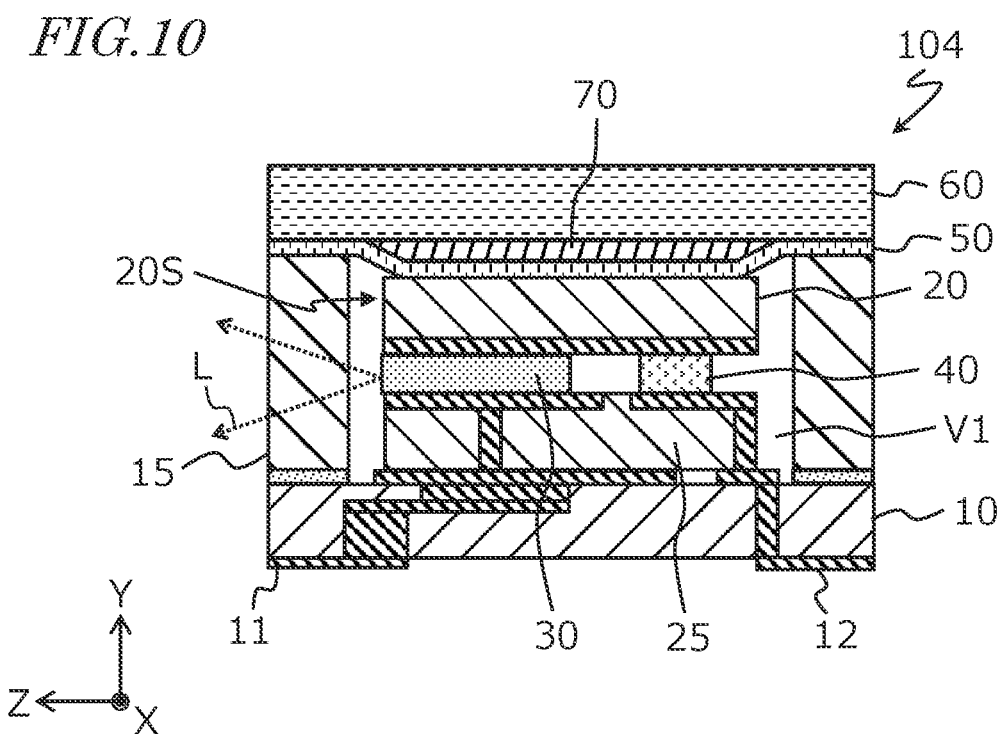
FIG. 10 is a cross-sectional view paralleling a YZ plane of a light source device of another form according to the first embodiment.

FIG. 10 is a cross-sectional view paralleling a YZ plane of a light source device 104. When viewed from above, at least a portion of the outer edge of the heat conducting member 70 can be positioned outward of the outer edge of the first submount 20. In the light source device 104 shown in FIG. 10, the heat conducting member 70 entirely fills the gap between the first submount 20 and the heat dissipating block 60 (or the space V2 shown in FIG. 5A). According to the light source device 104, the increased volume of the heat conducting member 70 can further improve the heat dissipation performance.

A light source device according to the first embodiment can include an opening for allowing the outgas, if generated from the heat conducting member 70, to escape from the space V2 to the outside of the light source device.

Figure 11:
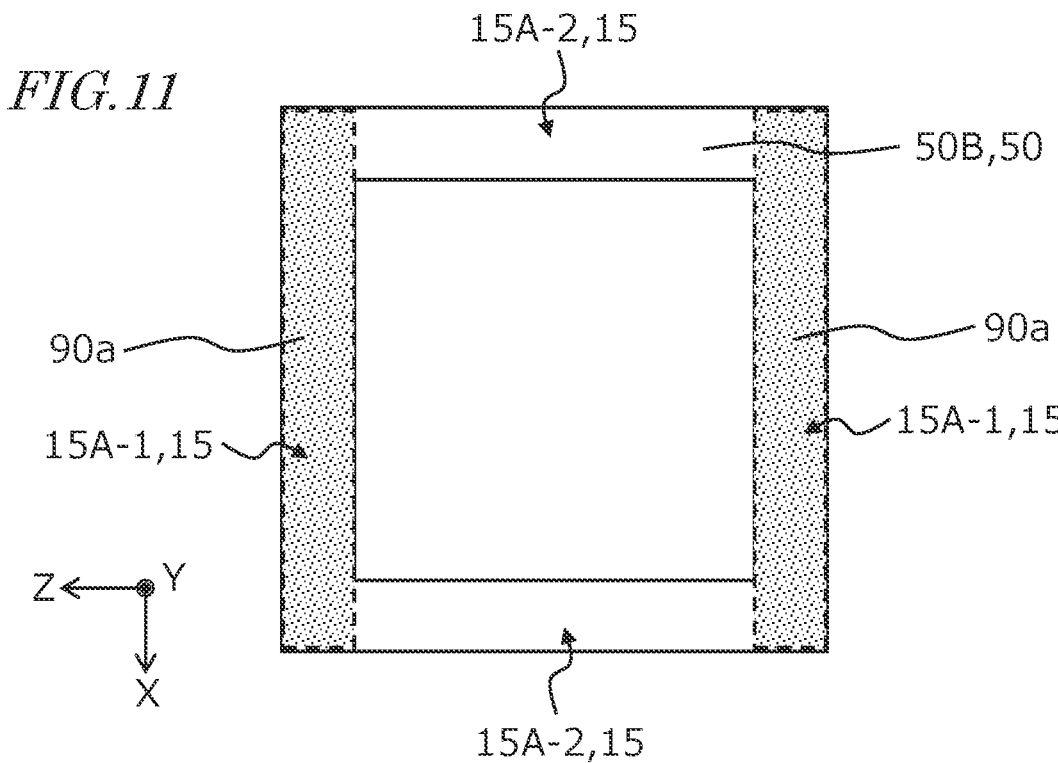
FIG. 11 is a plan view of the second portion of a sealing member bonded to the first upper face of the lateral wall part.
Figure 12A:
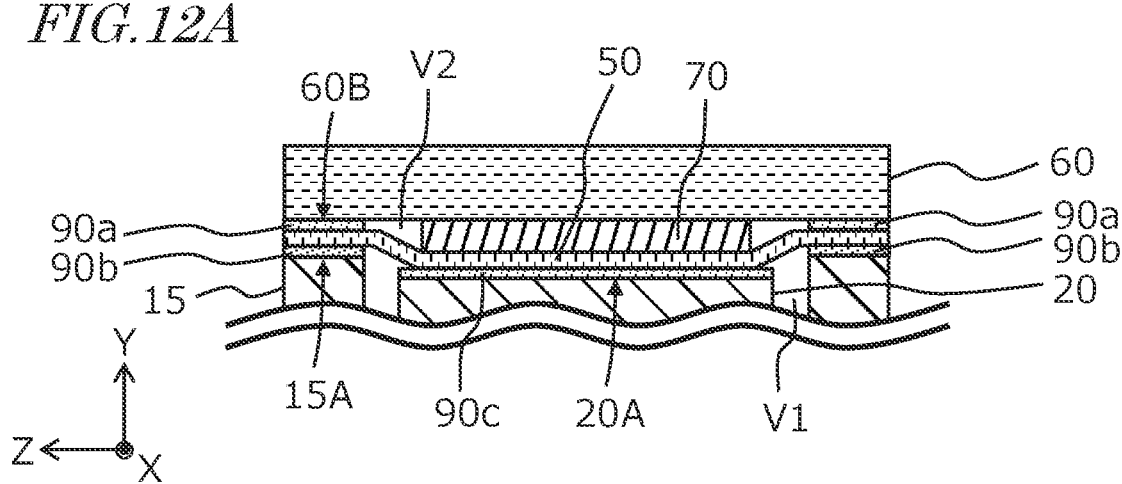
FIG. 12A is an enlarged cross-sectional view enlarging the portion where the sealing member is bonded to the first upper face of the lateral wall part and the lower face of the heat dissipating block.
Figure 12B:
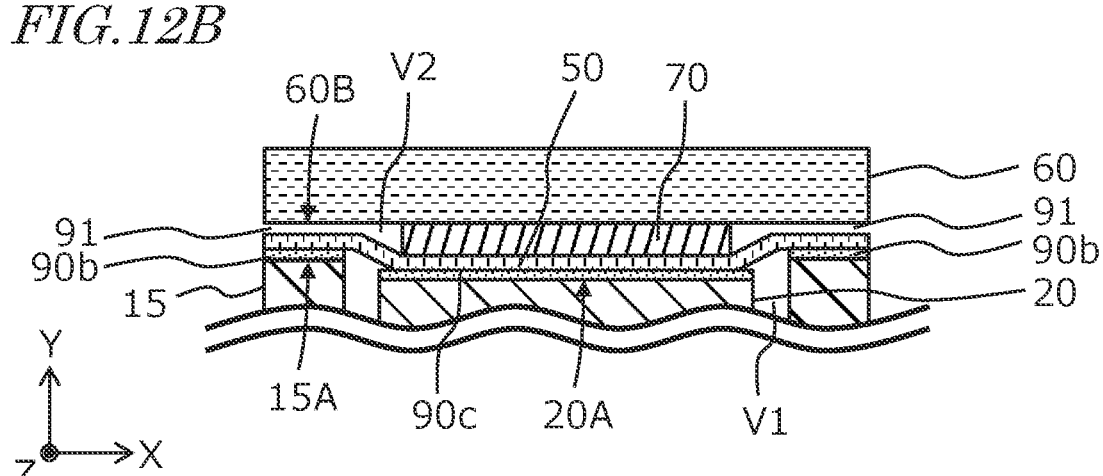
FIG. 12B is an enlarged cross-sectional view enlarging the portion where the sealing member is bonded to the first upper face of the lateral wall part and the lower face of the heat dissipating block.

FIG. 11 is a plan view of the second portion 50B of the sealing member 50 bonded to the upper face 15A of the lateral wall part 15. FIG. 12A and FIG. 12B are enlarged cross-sectional views each enlarging the portion where the sealing member 50 is bonded to the first upper face 15A of the lateral wall part 15 and the lower face 60B of the heat dissipating block 60. The enlarged cross section shown in FIG. 12A corresponds to the enlarged cross section shown in FIG. 5A, and the cross section shown in FIG. 12B corresponds to the enlarged cross section shown in FIG. 5B.

As shown in FIG. 11, the heat dissipating block 60 can be supported along at least two of the four sides of the periphery of the first upper face 15A of the lateral wall part 15. When viewed from above, the first upper face 15A and the second portion 50B of the sealing member 50 are both quadrangular frame shaped. A bonding member 90a is disposed on the portions of the second portion 50B of the sealing member 50 located on the pair of regions 15A-1 of the upper face 15A that extend in the X direction, i.e., a bonding member 90a is not disposed on the other portions located on the pair of regions 15A-2 that extend in the Z direction (regions other than the 15A-1 regions).

The heat dissipating block 60 illustrated in FIG. 12A and FIG. 12B is supported along the two sides extending in the X direction among the four sides of the first upper face 15A of the lateral wall part 15. To explain more specifically, the heat dissipating block 60 is supported by the bonding member 90a extending in the X direction disposed along the two sides of the periphery of the first upper face 15A extending in the X direction among the four sides. Even if the bonding member 90a is disposed in such locations, the space V1 can be hermetically sealed by the bonding member 90b and the sealing member 50.

The bonding member 90a interposed between the heat dissipating block 60 and the sealing member 50 can have an opening that connects the space V2 where the heat conducting member 70 is located and the outside. According to the structure illustrated in FIG. 12A and FIG. 12B, an opening 91 is formed along the Z direction between the sealing member 50 and the heat dissipating block 60. The opening 91 can play the role of expelling the outgas that might result from the heat conducting member 70 to the outside of the light source device. In this manner, the outgas containing organic matter if resulted from the heat conducting member 70 can be let out through the opening 91 to thereby reduce the dust collecting effect of the laser beam.

Figure 13:
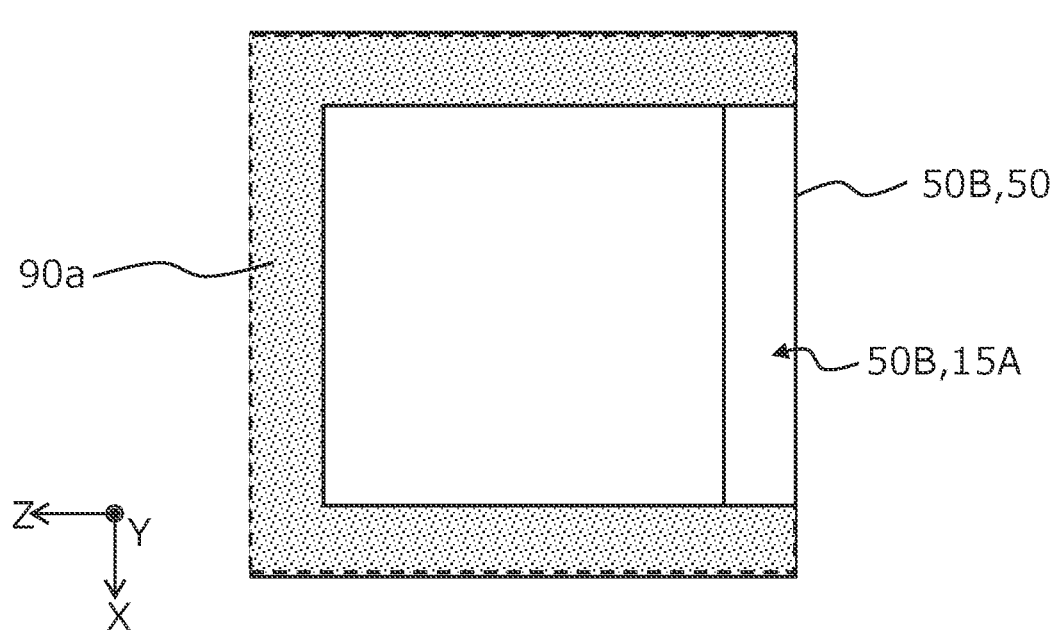
FIG. 13 is a plan view explaining the structure of a bonding member having an opening on the rear face side of the laser diode.
Figure 14:
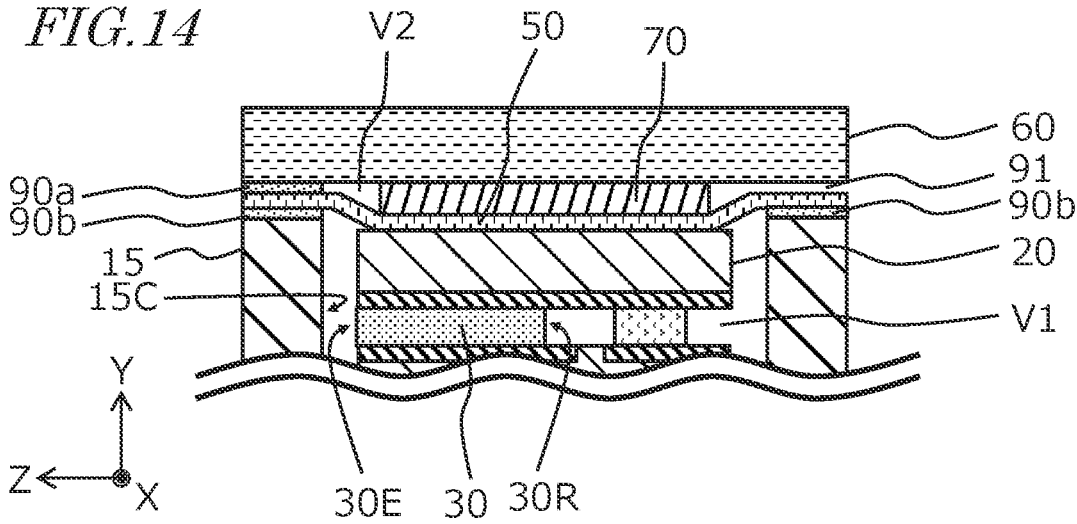
FIG. 14 is an enlarged cross-sectional view explaining the structure of a bonding member having an opening on the rear face side of the laser diode.

FIG. 13 and FIG. 14 are a plan view and an enlarged cross section, respectively, explaining the structure in which the bonding member has an opening 91 on the rear face 30R side of the laser diode 30. The plan view in FIG. 13 and a cross-sectional view in FIG. 14 correspond to the plan view in FIG. 11 and a cross-sectional view in FIG. 12, respectively.

As illustrated in FIG. 14, the laser diode 30 has an emission face 30E having an emission region through which a laser beam is emitted, and a rear face 30R located opposite the emission face 30E. The opening 91 in the structure illustrated in FIG. 13 and FIG. 14 is provided between the heat dissipating block 60 and the sealing member 50 on the rear face 30R side of the laser diode 30. In other words, only a bonding member 90b is provided between the heat dissipating block 60 and the lateral wall part 15 on the rear face 30R side of the laser diode 30. On the other hand, a bonding member 90a and a bonding member 90b are provided between the heat dissipating block 60 and the lateral wall part 15 on the emission face 30E side.

Providing an opening 91 on the laser diode's rear face 30R side, distancing it from the emission face 30E as much as possible, can reduce the outgas reaching or coming near the emission region of the laser diode 30. Furthermore, supporting the heat dissipating block 60 along the two sides extending in the Z direction and one side extending in the X direction among the four sides of the periphery of the first upper face 15A of the lateral wall part 15 can increase the contact areas between the heat dissipating block 60 and the sealing member 50 thereby ensuring the mechanical strength for retaining the heat dissipating block 60. The shape and the position of the opening 91 are not limited to those shown in the example described above. The opening 91 has only to have a shape to allow it to exert the function of expelling the outgas from the space V2 to the outside. For example, as the opening 91, a single or multiple exhaust holes can be provided in a localized portion of the bonding member 90a.

Figure 15:
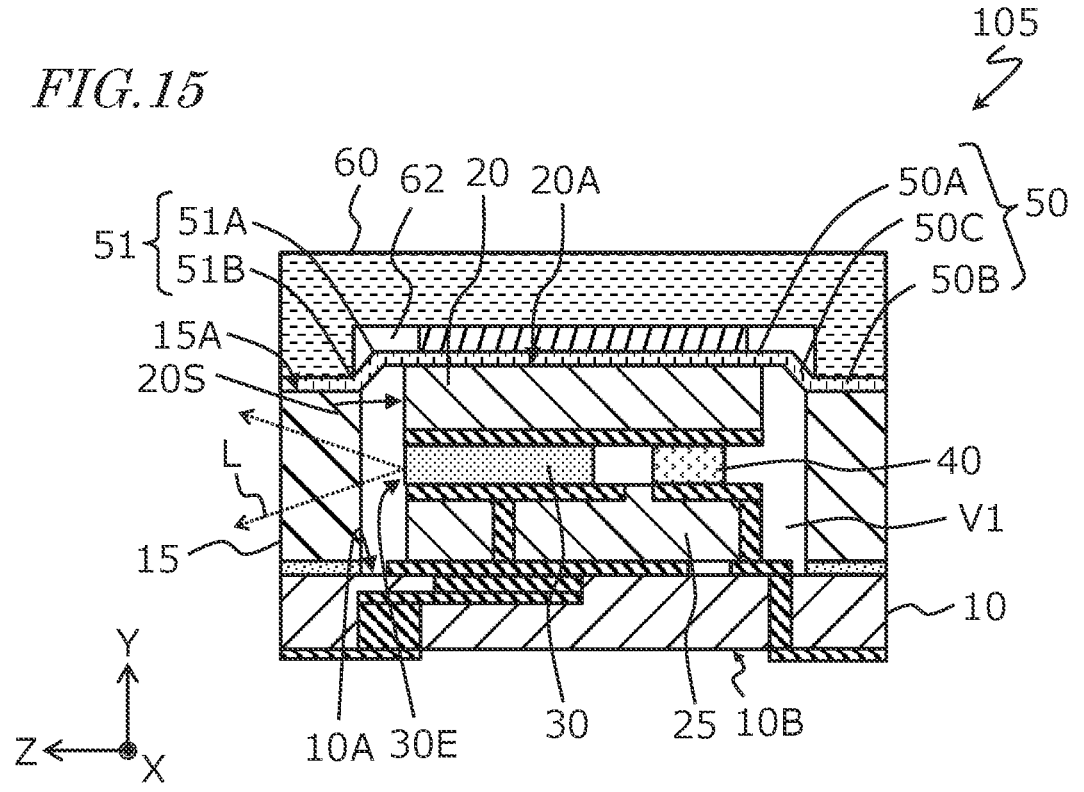
FIG. 15 is a cross-sectional view paralleling a YZ plane of a variation of the light source device according to the first embodiment of the present disclosure.
Figure 16:
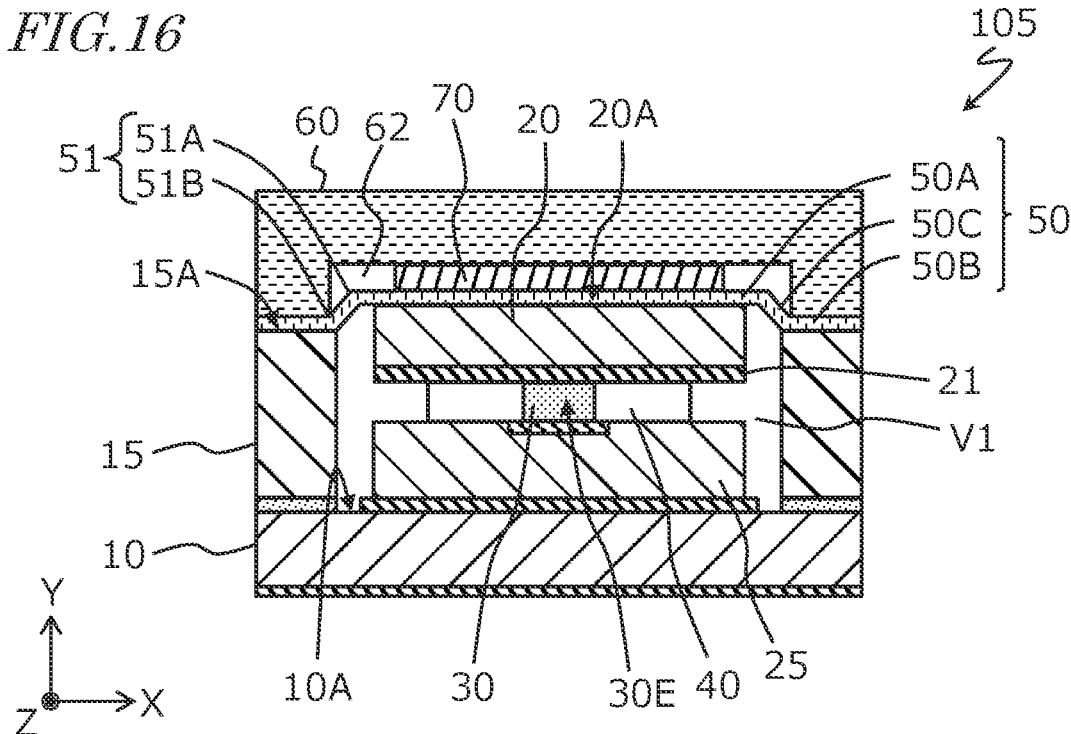
FIG. 16 is a cross-sectional view paralleling an XY plane of the variation of the light source device according to the first embodiment of the present disclosure.
Figure 17:
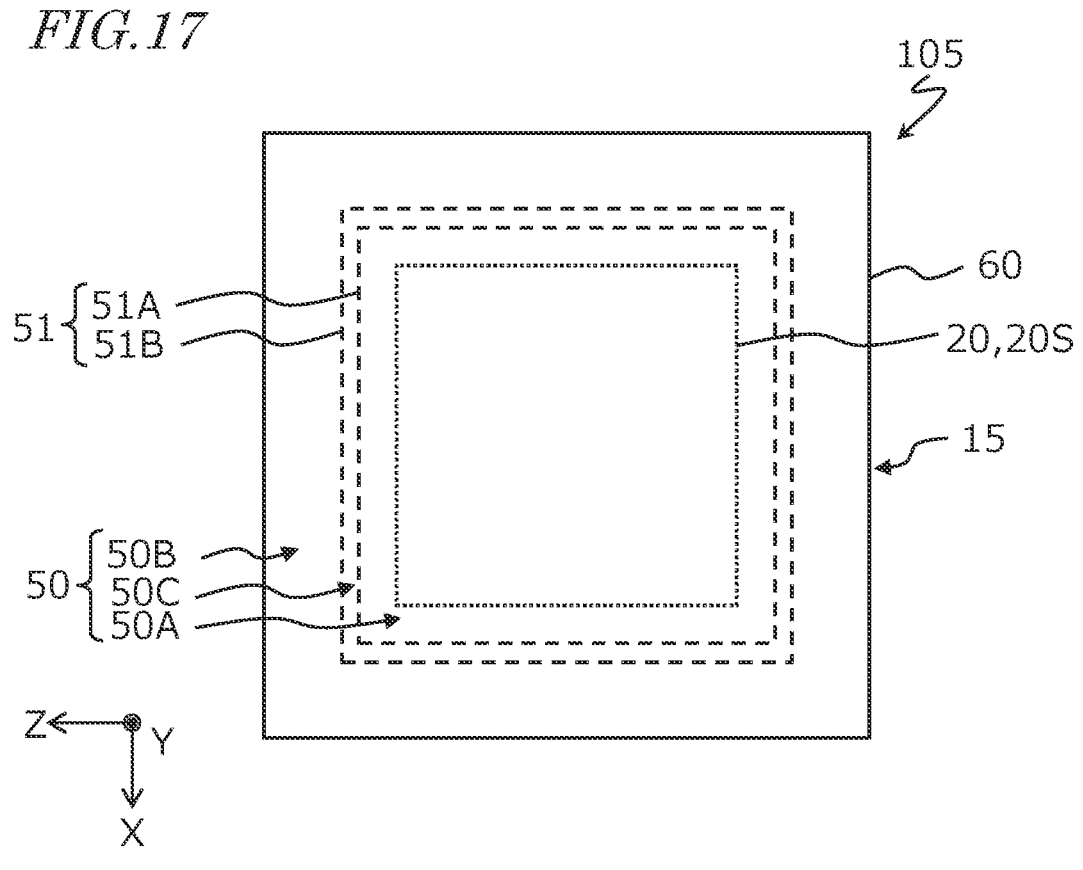
FIG. 17 is a plan view of the variation of the light source device according to the first embodiment of the present disclosure.

FIG. 15 is a cross-sectional view paralleling a YZ plane of a light source device 105 that is a variation of the first embodiment. The cross section shown in FIG. 15 includes the cross sections of the laser diode 30 and the conducting member 40. The broken lines indicate the laser light L exiting the emission face 30E of the laser diode 30 in the Z direction. FIG. 16 is a cross-sectional view paralleling an XY plane of the light source device 105. The cross section shown in FIG. 16 includes the emission face 30E of the laser diode 30. FIG. 17 is a plan view of the light source device 105 when viewed from above. In FIG. 17, the periphery of the second upper face 20A of the first submount 20 located in the package is indicated by dotted lines and the first deformed part 51A and the second deformed part 51B of the sealing member 50 are indicated by broken lines to make the relative positions of the first submount 20 and the heat dissipating block 60 easier to understand. The differences between the light source device 100 and the light source device 105 will primarily be explained below.

In the light source device 105 illustrated in FIG. 15 and FIG. 16, the height of the first upper face 15A from the support face 10A is smaller than the height of the second upper face 20A from the support face 10A. The heat dissipating block 60 in the light source device 105 is U-shaped in a cross section paralleling an XY plane and in a cross section paralleling a YZ plane. The heat dissipating block 60 has a recess 62 that houses the heat conducting member 70 and at least a portion of the first submount 20.

As illustrated in FIG. 17, when viewed from above, the heat dissipating block 60 encloses the first submount 20. In other words, the size of the heat dissipating block 60 in an XZ plane is larger than the size of the first submount 20 in the XZ plane. When viewed from above, the first deformed part 51A is located outward of the first lateral faces 20S of the first submount 20. In this manner, the first deformed part 51A does not come into contact with the sides of the second upper face 20A of the submount 20 that meet the first lateral faces 20S (i.e., the corners of the member). By adjusting the position of the first deformed part 51A so as not to contact the corners of the member, damage to the sealing member 50 that could otherwise result can be reduced in the light source device 105 as well.

In the case of a light source device 105, using a sealing member 50 having a deformed part 51 as a cap for sealing the package can absorb the height difference between the second upper face 20A and the first upper face 15A. Accordingly, similar to the light source device 100, fine height adjustments of the members are unnecessary, and double-sided bonding of the laser diode 30 is made easy. Furthermore, the heat conducting member 70 can improve the heat dissipation performance, and allowing the lateral wall part 15 to support the heat dissipating block 60 can secure the mechanical strength for retaining the heat dissipating block 60.

Figure 18:
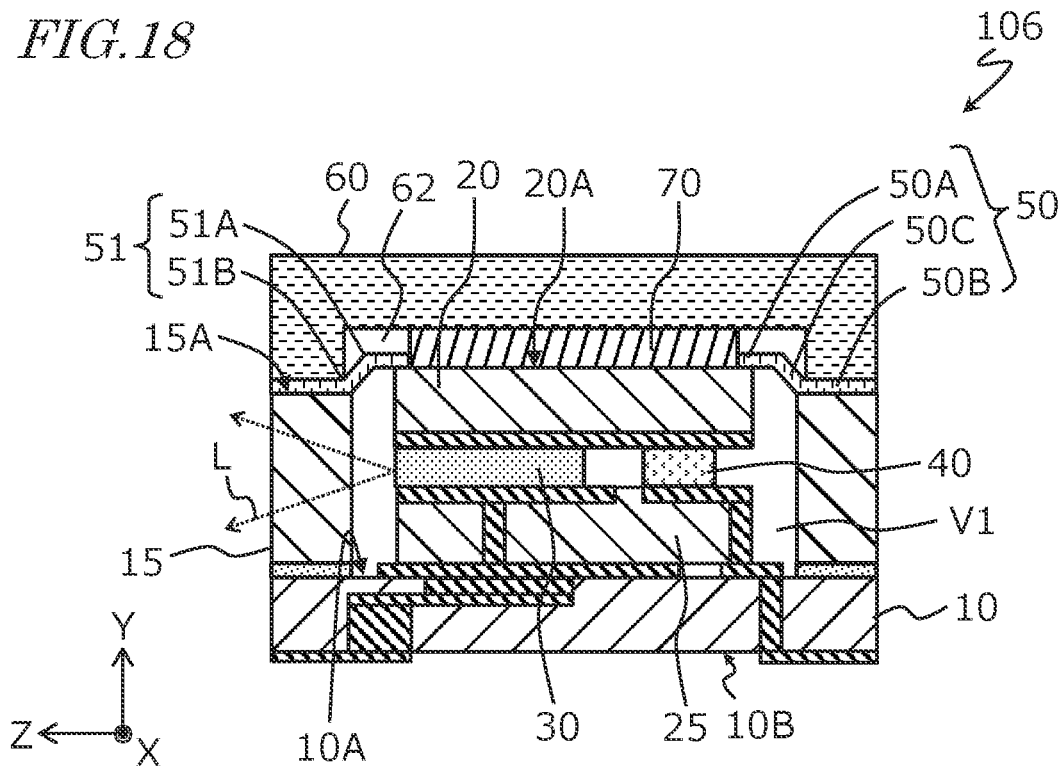
FIG. 18 is a cross-sectional view paralleling a YZ plane of another variation of the light source device according to the first embodiment of the present disclosure.

FIG. 18 is a cross-sectional view paralleling a YZ plane of a light source device 106 that is another variation of the first embodiment. As illustrated in FIG. 18, the first portion 50A of the sealing member 50 does not have to be formed between the heat conducting member 70 and the first submount 20. In this case, similar to the light source device 102 described earlier, the first portion 50A can be formed only in the peripheral region of the second upper face 20A of the first submount 20.

An example of a method of manufacturing a light source device 100 according to the first embodiment will be explained. In this manufacturing method example, metal foil is used as the sealing member 50. FIG. 19A to FIG. 19E are cross sections explaining each manufacturing step included in the method of manufacturing a light source device 100.

Figure 19A:
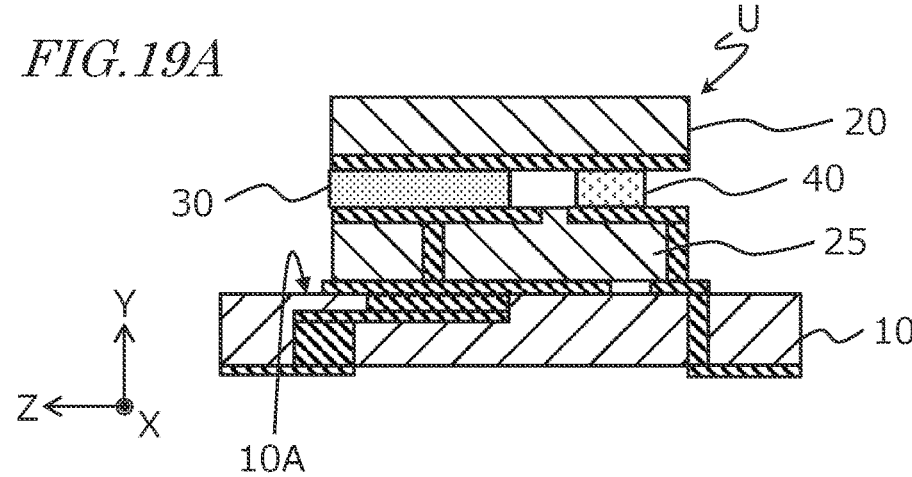
FIG. 19A is a sectional view explaining a manufacturing step included in an example of a method of manufacturing a light source device according to the first embodiment of the present disclosure.

First, as shown in FIG. 19A, a light source unit U having a first submount 20 and a laser diode 30 bonded to the first submount 20 is bonded to the support face 10A of a substrate 10. For example, a light source unit U is prepared by mounting a laser diode 30 and a conducting member 40 on a second submount 25, followed by bonding a first submount 20 to the laser diode 30 and the conducting member 40. The light source unit U is then bonded to the support face 10A of a substrate 10.

Figure 19B:
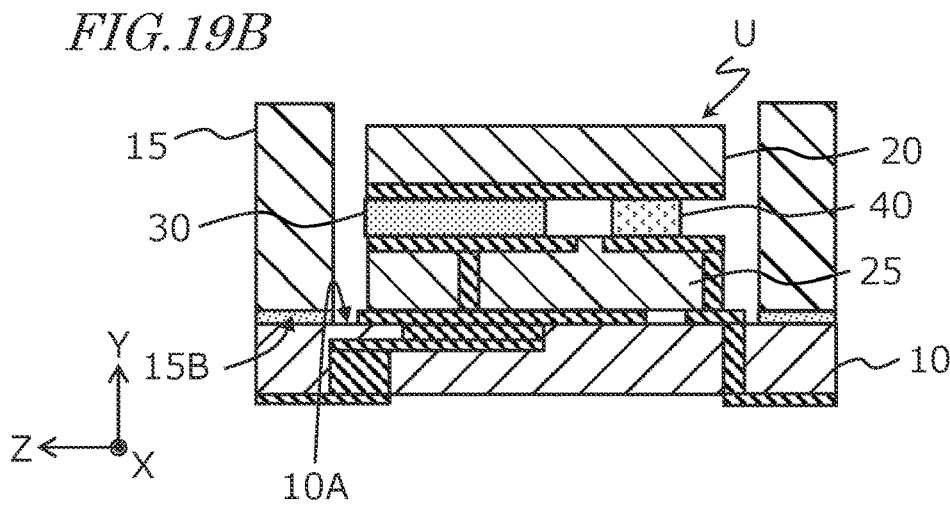
FIG. 19B is a sectional view explaining a manufacturing step included in the example of a method of manufacturing a light source device according to the first embodiment of the present disclosure.

Then as shown in FIG. 19B, a lateral wall part 15 is bonded to the support face 10A to surround the light source unit U. For example, the lower face 15B of the lateral wall part 15 is bonded to the support face 10A via a bonding member by sintering, brazing, soldering, ultrasonic welding, resistance welding, or laser welding. Examples of materials for the bonding member are as previously described. The lower face 15B of the lateral wall part 15 may be bonded to the support face 10A before bonding the light source unit U and the support face 10A of the substrate 10.

Figure 19C:
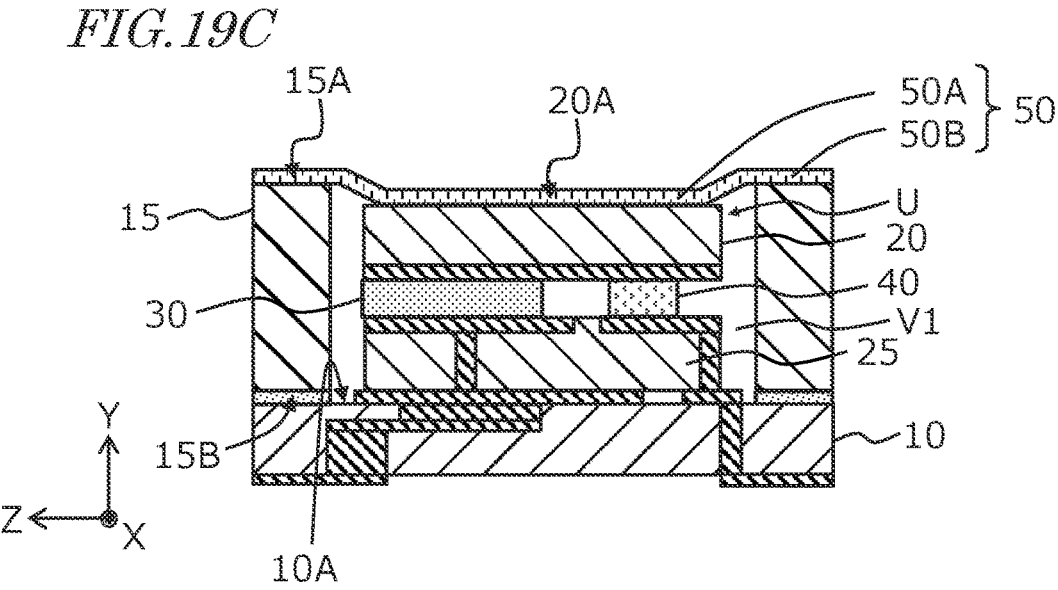
FIG. 19C is a sectional view explaining a manufacturing step included in the example of a method of manufacturing a light source device according to the first embodiment of the present disclosure.

Then as shown in FIG. 19C, a sealing member 50 is bonded to the first submount 20 and the lateral wall part 15 to seal the light source unit U in the space V1 defined by the substrate 10 and the lateral wall part 15. To explain more specifically, the package in which the light source unit U is mounted is hermetically sealed by bonding the second portion 50B of the sealing member 50 to the first upper face 15A of the lateral wall part 15 via a bonding member 90b (see FIG. 5A), and the first portion 50A of the sealing member 50 to the second upper face 20A of the first submount 20 via a bonding member 90c (see FIG. 5A). In the hermetic sealing step, the metal foil is allowed to deform to absorb the height difference between the first upper face 15A and the second upper face 20A, if any.

Figure 19D:
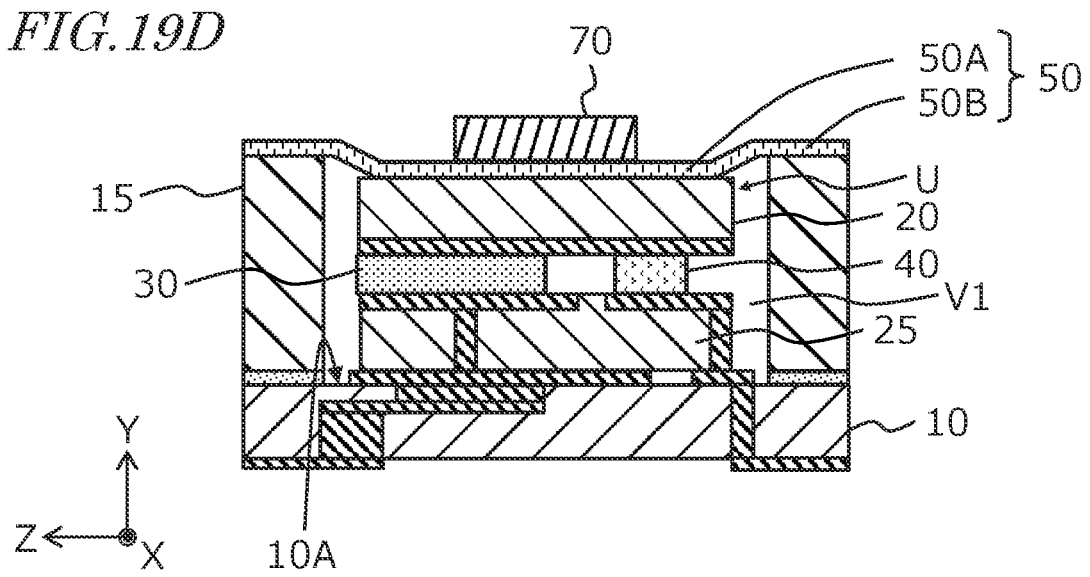
FIG. 19D is a sectional view explaining a manufacturing step included in the example of a method of manufacturing a light source device according to the first embodiment of the present disclosure.

Then as shown in FIG. 19D, a heat conducting member 70 is disposed above the first submount 20 of the light source unit U. The heat conducting member 70 is disposed on the first portion 50A of the sealing member 50. As described later, the order of bonding the sealing member 50 and disposing the heat conducting member 70 may be reversed. For example, prior to bonding the sealing member 50, the heat conducting member 70 may be disposed on the sealing member 50, followed by bonding the heat conducting member 70 to the sealing member 50 by a hardening heat treatment. In other words, the sealing member 50 to which a heat conducting member 70 has already been bonded may be bonded to the first submount 20 and the lateral wall part 15.

Various bonding methods can be employed in bonding the sealing member 50 and the lateral wall part 15, bonding the sealing member 50 and the first submount 20, and bonding the heat conducting member 70 and the sealing member 50. In a first example, the sealing member 50 is bonded to the first face 15A of the lateral wall art 15 and the second face 20A of the first submount 20 by applying the bonding members 90b and 90c described earlier (see FIG. 5A) to the first upper face 15A and the second upper face 20A, respectively, followed by performing a hardening heat treatment by means of, for example, sintering, brazing, soldering, ultrasonic welding, resistance welding, or laser welding. The heat treatment temperature (hardening temperature) range is, for example, 200° C. or higher but under 300° C.

Subsequent to bonding the sealing member 50 to the first upper face 15A and the second upper face 20A, the heat conducting member 70 is hardened. For example, the heat conducting member 70 can be bonded to the sealing member 50 by applying the heat conducting member 70 on the first portion 50A of the sealing member 50 and allowing it to harden by heating or laser beam irradiation. When using a heat dissipating grease or carbon sheet as the heat conducting member 70, for example, the bonding of the heat conducting member 70 and the sealing member 50 is unnecessary, and the heat conducting member 70 has only to be brought into contact with the sealing member 50. Here, the hardness of the heat conducting member 70 subsequent to hardening is higher than the hardness prior to hardening. For example, a heat conducting member 70 that is in liquid state prior to hardening turns into solid after hardening.

In a second example, bonding members 90b and 90c are applied to the first upper face 15A of the lateral wall part 15 and the second upper face 20A of the first submount 20, respectively, and a heat conducting member 70 is applied on the first portion 50A of the sealing member 50. The heat conducting member 70 is bonded to the sealing member 50 by thermocompression bonding (or diffusion bonding) while melting the bonding members 90b and 90c by raising the temperature. Subsequent to thermocompression bonding, the sealing member 50 is bonded to the first upper face 15A and the second upper face 20A by allowing the bonding members 90b and 90c to harden by lowering the temperature.

In a third example, bonding members 90b and 90c are applied to the first upper face 15A of the lateral wall part 15 and the second upper face 20A of the first submount 20, respectively, and a heat conducting member 70 is applied on the first portion 50A of the sealing member 50. For example, while heating and melting the bonding member 90b by irradiating a laser beam from the outside of the package, a heat source such as a heater may be used to heat the package from the lower face 10B side of the substrate 10 to conduct heat to and harden the bonding member 90c and the heat conducting member 70. As described above, the bonding of the sealing member 50 and the lateral wall part 15 and the bonding of the heat conducting member 70 and the sealing member 50 may be performed while allowing for a difference between the two bonding temperatures. Furthermore, applying a load on the entire first upper face 15A may be avoided, i.e., the load applying area may be limited. The sealing member may be bonded to the lateral wall part 15 by laser welding by irradiating a laser beam on a certain spot on the first upper face 15A. This facilitates the plastic deformation of the sealing member 50, which, as a result, can enhance the adhesion of the sealing member 50.

As another example, a sealing member 50 may be fixed to the lateral wall part 15 by using gold bumps and ultrasonic welding, for example, while conducting heat to and hardening the heat conducting member 70 by heating the package from the lower face 10B side of the substrate 10 with a heat source such as a heater. Alternatively, while melting the bonding members 90b and 90c by heating the peripheral portion of the lateral wall part 15 from above the package with a first heat source, heat may be conducted to thereby harden the heat conducting member 70 by heating the package from the lower face 10B side with a second heat source set at a lower temperature than the temperature of the first heat source.

In a fourth example, the heat conducting member 70 is bonded to the first portion 50A of the sealing member 50 by thermocompression bonding prior to applying the bonding members 90b and 90c on the first upper face 15A of the lateral wall part 15 and the second upper face 20A of the first submount 20, respectively. The sealing member 50 to which a heat conducting member 70 is bonded may be bonded to the first upper face 15A and the second upper face 20A in a deformed state so as to form filets.

Figure 19E:
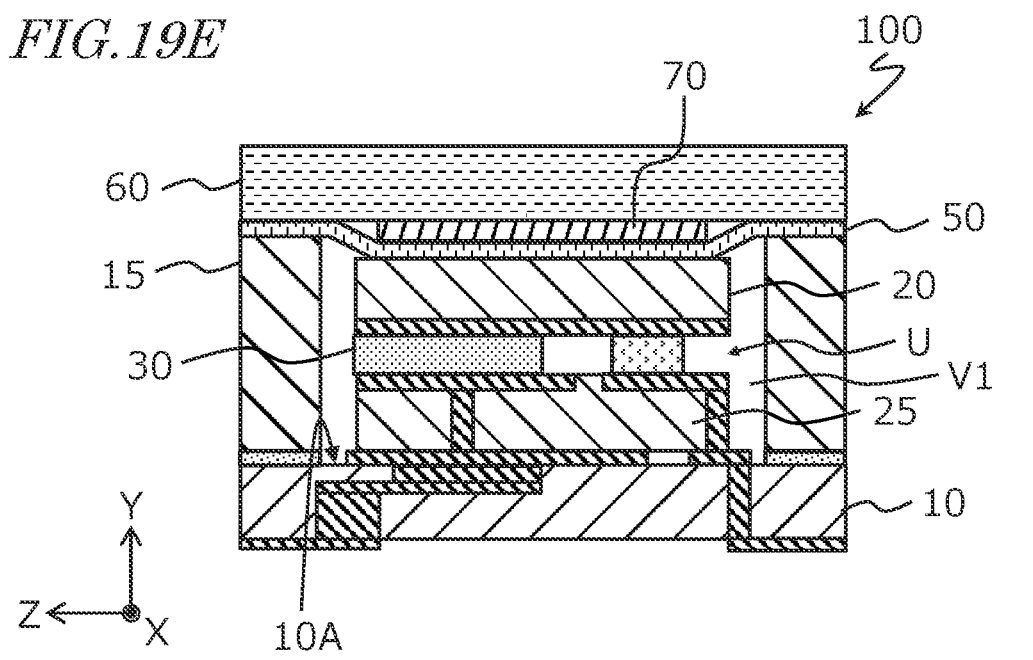
FIG. 19E is a sectional view explaining a manufacturing step included in the example of a method of manufacturing a light source device according to the first embodiment of the present disclosure.

Lastly, as shown in FIG. 19E, the heat conducting member 70 is allowed to deform to bond the heat dissipating block 60 to the lateral wall part 15 via the sealing member 50 to thereby bring the heat dissipating block 60 into thermal contact with the heat conducting member 70. To explain more specifically, a bonding member 90a is applied to the second portion 50B of the sealing member 50 (see FIG. 5A), and the heat dissipating block 60 is bonded to the sealing member 50 by a hardening heat treatment by means of, for example, sintering, brazing, soldering, ultrasonic welding, resistance welding, or laser welding.

By following the steps described above, a light source device 100 can be obtained.

Another example of a method of manufacturing a light source device 100 according to the first embodiment will be explained.

A light source unit U is prepared by mounting a laser diode 30 and a conducting member 40 on a second submount 25. The light source unit U is bonded to the support face 10A of a substrate 10, and a lateral wall part 15 is bonded to the support face 10A to surround the light source unit U. Separately from these steps, a cap unit for sealing the package is prepared by bonding a first submount 20 to a sealing member 50. Then the package in which the light source unit U and the lateral wall part 15 are mounted is hermetically sealed by bonding the first submount 20 included in the cap unit to the laser diode 30 and the conducting member 40, followed by bonding the second portion 50B of the sealing member 50 included in the cap unit to the first upper face 15A of the lateral wall part 15. Then a heat conducting member 70 is applied on the first portion 50A of the sealing member 50. Lastly, the heat conducting member 70 is deformed to bond the heat dissipating block 60 to the lateral wall part 15 via the sealing member 50, bringing the heat dissipating block 60 into thermal contact with the heat conducting member 70.

In the examples of manufacturing methods described above, for example, multiple light source units and lateral wall parts individually surrounding the light source units are mounted on a substrate. Then a sealing member, a heat dissipating block, and a heat conducting member are disposed. As in the first example of a manufacturing method described above, subsequent to bonding a first submount to each of the light source units, a sealing member may be disposed to cover the lateral wall parts, followed by providing each light source unit with a heat dissipating block. As in the second example of a manufacturing method, cap units may be prepared to be individually bonded to the light source units. Lastly, the substrate having the members mounted thereon is divided into device units by dicing or the like at the positions in the lateral wall part 15 between adjacent light source units. In this manner, a number of light source devices can be manufactured. In either case, the dividing is conducted after bonding the sealing member and the lateral wall parts, i.e., in a hermetically sealed state. Thus, the hermetic seal is maintained by each device subsequent to dividing.

Second Embodiment

Examples of light source devices according to a second embodiment of the present disclosure will be explained with reference to FIG. 20 to FIG. 22. The differences from a light source device according to the first embodiment will primarily be explained.

Figure 20:
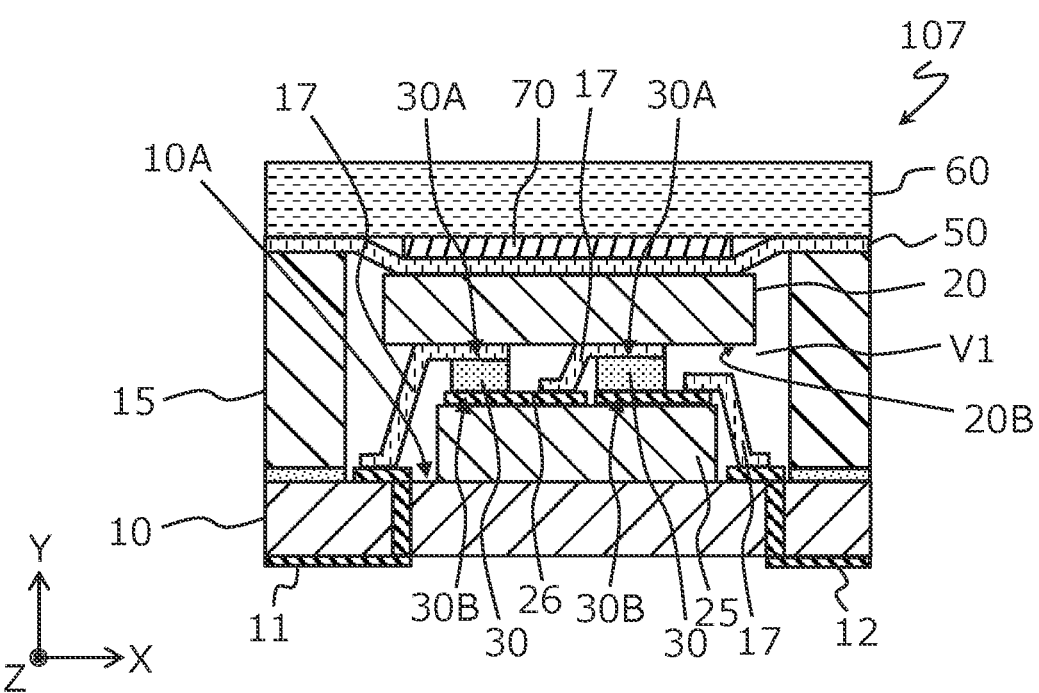
FIG. 20 is a cross-sectional view paralleling an XY plane of a light source device according to a second embodiment of the present disclosure.

FIG. 20 is a cross-sectional view paralleling an XY plane of a light source device 107 equipped with a plurality of laser diodes 30. In the example shown in FIG. 20, the light source device 107 has two laser diodes 30. Each of the two laser diodes 30 has a p-side electrode face 30B and an n-side electrode face 30A. The number of laser diodes 30 included in the light source device 107 is not limited to two, and may be three or more. The laser diodes 30 can emit light of different colors from one another. For example, mounting three laser diodes in the light source device each emitting light of one of RGB colors can produce a light source device that can be used as the backlight of a display device. The laser diodes 30 may emit light of the same color. In this case, a high output laser light emitting light source device can be achieved.

The laser diodes 30 and the external connection electrodes 11 and 12 can be electrically connected by using ribbon wires 17 in place of the conducting member 40 described earlier. This eliminates the need for disposing a wiring layer on the first submount 20. In the light source device 107 illustrated in FIG. 20, the n-side electrode face 30A located on the upper face of one of the two laser diodes 30 is electrically connected to the conductor wiring of the support face 10A by a ribbon wire 17, and not connected to a wiring layer of the first submount 20 or a conducting member. The other n-side electrode face 30A is electrically connected to the second wiring layer 26 of the second submount 25 by a ribbon wire 17, and not connected to a wiring layer of the first submount 20 or a conducting member. The p-side electrode face 30B of each of the two laser diodes 30 is electrically connected to the second wiring layer 26 of the second submount 25. Furthermore, the second wiring layer 26 of the second submount 25 and the conductor wiring layer of the support face 10A are electrically connected by a ribbon wire 17. Accordingly, the external connection electrode 11, a ribbon wire 17, the laser diode 30 (on the left in FIG. 20), a ribbon wire 17, the laser diode 30 (on the right in FIG. 20) and a ribbon wire 17, and the external connection electrode 12 are electrically connected in series in that order.

A ribbon wire 17 is formed from a metal material, such as gold, copper, aluminum, or an alloy of these. From the electric corrosion standpoint, gold or copper is preferably used. A ribbon wire 17 can be bonded to an electrode face of a laser diode 30, the conductor wiring layer of the support face 10A, or the second wiring layer 26 of the second submount 25 by, for example, soldering or ultrasonic welding via the bonding member described earlier. The thickness of a ribbon wire 17 is, for example, about 0.01 mm to about 0.5 mm. Because a ribbon wire 17 has a small thickness, the height variations of the members described earlier can be controlled easily. Furthermore, because the allowable current-carrying capacity of a ribbon wire is relatively large, a greater amount of current is allowed to flow through a laser diode.

Another example of a light source device according to the second embodiment includes a plurality of laser diodes, a plurality of conducting members individually corresponding to the laser diodes, and one or more support members. In other words, the total number of conducting members and support members is larger than the number of laser diodes.

Figure 21:
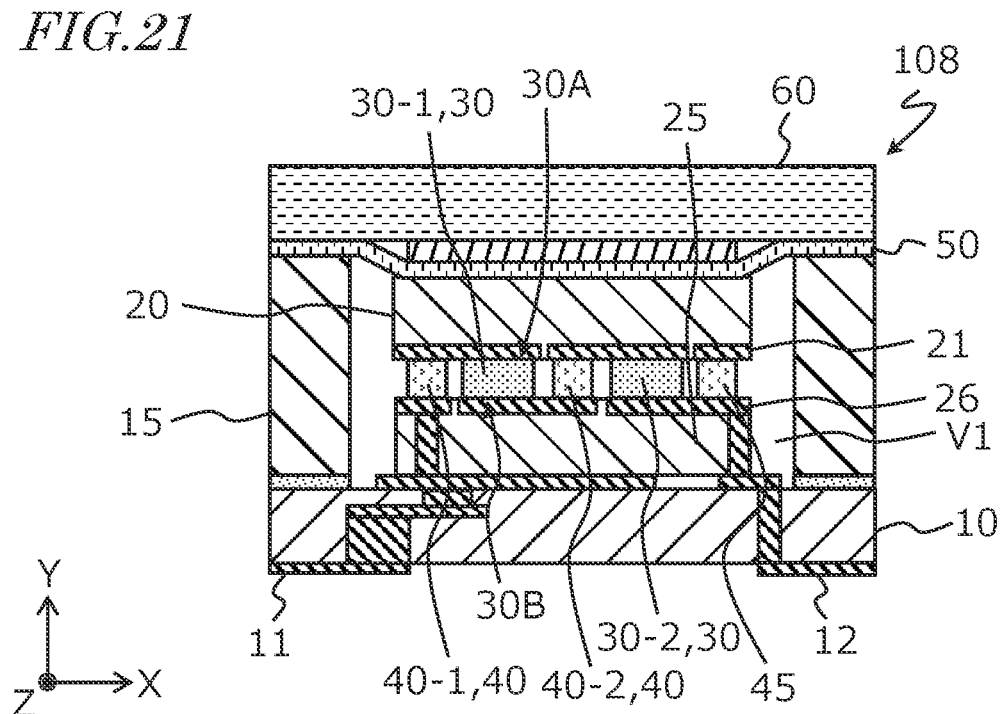
FIG. 21 is a cross-sectional view paralleling an XY plane of a light source device of another form according to a second embodiment of the present disclosure.

FIG. 21 is a cross-sectional view paralleling an XY plane of a light source device 108. FIG. 22 is a plan view of the second submount 25 when viewed from above in the state of supporting two laser diodes 30, two conducting members 40 and one support member 45. In the example shown in FIG. 21, the two conducting members 40-1 and 40-2 that correspond to the two laser diodes 30-1 and 30-2, and a single support member 45 are disposed between the first submount 20 and the second submount 25.

The two laser diodes 30-1 and 30-2 are disposed such that their electrode faces of the same polarity oppose the first wiring layer 21 or the second wiring layer 26. In the example shown in FIG. 21, the n-side electrode faces 30A are bonded to the first wiring layer 21, and the p-side electrode faces 30B are bonded to the second wiring layer 26. In this case, the external connection electrode 11 is electrically connected to the n-side electrode face 30A of the laser diode 30-1 via the conducting member 40-1, the p-side electrode face 30B of the laser diode 30-1 is electrically connected to the n-side electrode face 30A of the laser diode 30-2 via the conducting member 40-2, and the p-side electrode face 30B of the laser diode 30-2 is electrically connected to the external connection electrode 12. In other words, in this example, the external connection electrode 11, the laser diode 30-1, the laser diode 30-2, and the external electrode 12 are connected in series in that order via two conducting members 40-1 and 40-2.

The support member 45 is a member not contributing to conductivity, and can be formed from, for example, a metal, silicon, glass, ceramic, or the same material for the substrate 10 described earlier. The support member 45 can be formed to have the same thickness as those of the laser diodes 30. The support member 45 in the second embodiment is a rectangular cuboid member having the same size as the conducting members 40, but is not limited to this shape. The lower face of the support member 45 can be bonded to the second wiring layer 26 of the second submount 25 via a bonding member, and the upper face of the support member 45 to the first wiring layer 21 of the first submount 20 via a bonding member.

Figure 22:
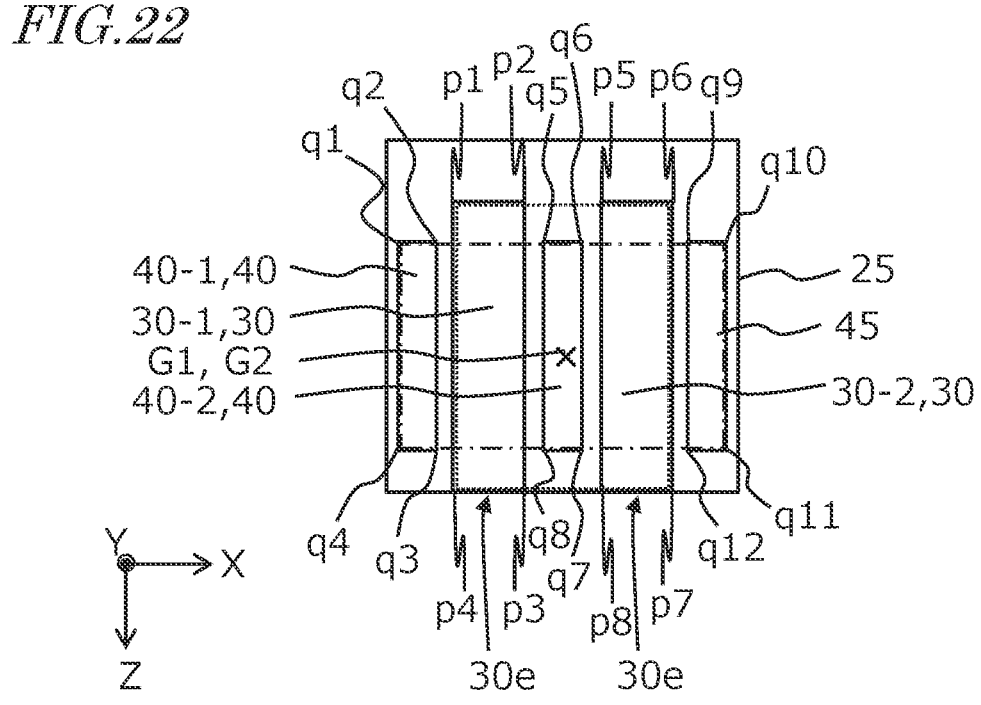
FIG. 22 is a top plan view of a second submount in the state of supporting two laser diodes, two conducting members, and a support member viewed in a direction normal to the support face of the substrate.

In the example shown in FIG. 22, the conducting member 40-1, the laser diode 30-1, the conducting member 40-2, the laser diode 30-2, and the support member 45 are arranged at intervals in that order along the X direction. The peripheries of the laser diodes 30, the conducting members 40, and the support member 45 are substantially quadrangular when viewed from above. The periphery of the laser diode 30-1 is formed by connecting the four points p1 to p4, and the periphery of the laser diode 30-2 is formed by connecting the four points p5 to p8. Similarly, the periphery of the conducting member 40-1 is formed by connecting the four points q1 to q4, the periphery of the conducting member 40-2 is formed by connecting the four points q5 to q8, and the periphery of the support member 45 is formed by connecting the four points q9 to q12. The long sides and the short sides of each of the laser diodes 30, the conducting members 40, and the support member 45 parallel the Z direction and the X directions, respectively. Here, being parallel can include tolerances of up to +5 degrees.

In the example shown in FIG. 22, the first geometric figure obtained by linking the points p1 to p8 of the laser diodes 30 is quadrangular, and the second geometric figure obtained by linking the points q1 to q12 of the conducting members 40 is also quadrangular. In FIG. 22, the first geometric figure is indicated by a dotted line, and the second geometric figure is indicated by a one-dot chain line. The conducting member 40-1, the laser diode 30-1, the conducting member 40-2, the laser diode 30-2, and the support member 45 are arranged on the second submount 25 such that the center of gravity G1 of the first geometric figure substantially coincides with the center of gravity G2 of the second geometric figure. The centers of the peripheries of the laser diodes 30-1 and 30-2 are located inward of the second geometric figure.

According to the light source device 108, when bonding the cap unit described earlier to the lateral wall part 15, the support member 45 can achieve a balance of the load applied to laser diodes 30 and the conducting members 40 and/or the center of gravity of the cap unit. Particularly, allowing the center of gravity of the first geometric figure to coincide with the center of gravity of the second geometric figure can improve the stability during the bonding of the members.

A light source device of the present disclosure can be suitably utilized as a light source in industrial applications that require a high output laser light source, for example, cutting and drilling of various materials, localized heat treatment, surface treatment, metal welding, 3D printing, and the like.

What is claimed is:

1. A light source device comprising:
a substrate having a support face;
a lateral wall part disposed on the substrate and having an upper face and inner wall faces, the inner wall faces defining a space;
a laser diode located in the space;
a first submount having a mounting face bonded to an upper face of the laser diode, and an upper face located opposite the mounting face;
a sealing member bonded to the upper face of the lateral wall part and the upper face of the first submount, thereby sealing the space;
a heat dissipating block located above the first submount; and
a heat conducting member located between the upper face of the first submount and a lowermost face of the heat dissipating block; wherein:
a height of the upper face of the lateral wall part from the support face differs from a height of the upper face of the first submount from the support face;
the heat conducting member is in thermal contact with the first submount and the heat dissipating block; and
the heat dissipating block is bonded to the upper face of the lateral wall part via the sealing member.

2. The light source device according to claim 1 wherein the heat conducting member has a thermal conductivity of 10 W/mK or higher.

3. The light source device according to claim 1, wherein the heat dissipating block is bonded to the sealing member via a bonding member made of an inorganic material, and the upper face of the lateral wall part is bonded to the sealing member via the bonding member.

4. The light source device according to claim 3, wherein the bonding member positioned between the heat dissipating block and the sealing member has an opening that connects a space between the first submount and the heat dissipating block in which the heat conducting member is located to an area outside the light source device.

5. The light source device according to claim 4, wherein:
the laser diode has an emission face that has an emission region through which laser light is emitted and that opposes one of the inner wall faces of the lateral wall part, and a rear face located opposite the emission face, and
the opening is located between the heat dissipating block and the sealing member on a rear face side of the laser diode.

6. The light source device according to claim 3 wherein a hardness of the bonding member is higher than a hardness of the heat conducting member.

7. The light source device according to claim 1, wherein:
the upper face of the lateral wall part has a rectangular frame shape when viewed from above in a direction normal to the support face, and
the heat dissipating block is supported along at least two of the four sides of a periphery of the upper face of the lateral wall part.

8. The light source device according to claim 1 wherein the sealing member is made of metal foil.

9. The light source device according to claim 8, wherein the sealing member includes a first portion bonded to the upper face of the first submount, a second portion bonded to the upper face of the lateral wall part, a connecting portion connecting the first portion and the second portion, a first deformed part located at a border between the first portion and the connecting portion, and a second deformed part located at a border between the second portion and the connecting portion.

10. The light source device according to claim 9, wherein at least part of the first portion is located between the heat conducting member and the first submount.

11. The light source device according to claim 9, wherein the first deformed part is located inward of the periphery of the first submount when viewed from above in a direction normal to the support face.

12. The light source device according to claim 1, wherein the height of the upper face of the first submount from the support face is smaller than the height of the upper face of the lateral wall part from the support face.

13. The light source device according to claim 1, wherein:
the height of the upper face of the first submount from the support face is greater than the height of the upper face of the lateral wall part from the support face, and the heat dissipating block has a recess that houses the heat conducting member and at least a portion of the first submount.

14. The light source device according to claim 1, wherein at least a portion of the periphery of the heat conducting member is located outward of the periphery of the first submount when viewed from above in a direction normal to the support face.

15. The light source device according to claim 1, further comprising a second submount having a lower face bonded to the support face, and a mounting face located opposite the lower face where the laser diode is/are disposed, the laser diode being bonded to the support face via the second submount.

16. A method of manufacturing a light source device comprising steps of:
providing a light source unit comprising a submount, and a laser diode bonded to the submount;
bonding the light source unit to a support face of a substrate such that the submount is above the laser diode;
bonding a lateral wall part to the support face of the substrate such that the lateral wall part surrounds the light source unit;
bonding a sealing member to the submount and the lateral wall part to seal the light source unit in a space defined by the substrate and the lateral wall part;
disposing a heat conducting member above the submount of the light source unit, the heat conducting member having a first overall height and a first overall width; and
deforming the heat conducting member to have a second overall height less than the first overall height and a second overall width greater than the first overall width, and bonding a heat dissipating block to the lateral wall part via the sealing member thereby bringing the heat dissipating block into thermal contact with the heat conducting member.

17. The method of manufacturing a light source device according to claim 16, further comprising a step of hardening the heat conducting member, wherein a hardness of the heat conducting member subsequent to hardening is higher than a hardness prior to hardening.

* * * * *